United States Patent
Itou

(10) Patent No.: US 11,798,976 B2
(45) Date of Patent: *Oct. 24, 2023

(54) LIGHT EMITTING ELEMENT ARRAY

(71) Applicant: Japan Display Inc., Tokyo (JP)

(72) Inventor: Osamu Itou, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/707,387

(22) Filed: Mar. 29, 2022

(65) Prior Publication Data

US 2022/0223647 A1    Jul. 14, 2022

Related U.S. Application Data

(63) Continuation of application No. 17/018,437, filed on Sep. 11, 2020, now Pat. No. 11,315,979.

(30) Foreign Application Priority Data

Sep. 12, 2019  (JP) .................................. 2019-166539

(51) Int. Cl.
   *H01L 27/15*    (2006.01)
   *G02B 5/02*     (2006.01)

(52) U.S. Cl.
   CPC .......... *H01L 27/156* (2013.01); *G02B 5/0257* (2013.01)

(58) Field of Classification Search
   CPC ........ H10K 65/00; H10K 50/00; H10K 59/00; H01L 33/58; H01L 25/0753; H01L 27/156; H01L 33/44; G02B 5/0257
   See application file for complete search history.

(56) References Cited

U.S. PATENT DOCUMENTS

| | | | |
|---|---|---|---|
| 9,213,196 B2 * | 12/2015 | Yata | ................. G02F 1/133615 |
| 10,330,831 B2 | 6/2019 | Sugiyama et al. | |
| 10,515,580 B2 | 12/2019 | Henry et al. | |
| 2006/0082699 A1 | 4/2006 | Gehlsen et al. | |
| 2013/0044510 A1 | 2/2013 | Yata et al. | |

(Continued)

FOREIGN PATENT DOCUMENTS

| | | |
|---|---|---|
| JP | 2017529557 A | 10/2017 |
| WO | 2015111523 A1 | 7/2015 |

*Primary Examiner* — Changhyun Yi
(74) *Attorney, Agent, or Firm* — K&L Gates LLP

(57) ABSTRACT

A light emitting element array is provided and includes substrate; light emitting elements arrayed to substrate; first anisotropic diffusion layer facing substrate with light emitting elements interposed between first anisotropic diffusion layer and substrate; and second anisotropic diffusion layer, wherein first anisotropic diffusion layer and second anisotropic diffusion layer are layered, first anisotropic diffusion layer and second anisotropic diffusion layer each include a region in an in-plane direction including a high refractive index region and a low refractive index region in a mixed manner, and absolute value of first angle formed by boundary between high refractive index region and low refractive index region of first anisotropic diffusion layer and direction perpendicular to substrate is different from absolute value of second angle formed by boundary between high refractive index region and low refractive index region of second anisotropic diffusion layer and direction perpendicular to substrate.

10 Claims, 14 Drawing Sheets

(56) References Cited

U.S. PATENT DOCUMENTS

2014/0340753 A1* 11/2014 Kusama ............... G02B 26/023
                                                              359/599
2018/0342704 A1* 11/2018 Gwon ................. H01L 27/3246
2019/0115508 A1    4/2019 Lin et al.
2020/0126477 A1    4/2020 Henry et al.

* cited by examiner

LIGHT EMITTING ELEMENT ARRAY

CROSS-REFERENCE TO RELATED APPLICATION

The present application is a continuation of U.S. patent application Ser. No. 17/018,437, filed on Sep. 11, 2020, which application claims priority from Japanese Application No. 2019-166539, filed on Sep. 12, 2019, the contents of which are incorporated by reference herein in its entirety.

BACKGROUND

1. Technical Field

What is disclosed herein relates to a display device.

2. Description of the Related Art

Displays with micro light emitting diodes (micro LEDs) serving as display elements have recently attracted attention (refer to Japanese Translation of PCT International Application Publication No. 2017-529557 (JP-T-2017-529557), for example). A plurality of LEDs are mounted on an array substrate (or a driver backplane in JP-T-2017-529557). WO 2015/111523 describes an anisotropic optical film used for a liquid crystal display panel.

Such a display with micro LEDs is expected to provide higher relative luminance of light in a direction in which an observer highly frequently observes the display, that is, in the normal direction of the array substrate. If the anisotropic optical film to be applied for a liquid crystal display panel is used for a display with LEDs without any change, the display property may possibly deteriorate.

SUMMARY

According to an aspect, a display device includes: a substrate; a plurality of pixels provided to the substrate; a plurality of light emitting elements provided to the pixels; a first anisotropic diffusion layer facing the substrate with the light emitting elements interposed between the first anisotropic diffusion layer and the substrate; and a second anisotropic diffusion layer. The first anisotropic diffusion layer and the second anisotropic diffusion layer are layered. The first anisotropic diffusion layer and the second anisotropic diffusion layer each include a region in an in-plane direction including a high refractive index region and a low refractive index region in a mixed manner. An absolute value of a first angle formed by a boundary between the high refractive index region and the low refractive index region of the first anisotropic diffusion layer and a direction perpendicular to the substrate is different from an absolute value of a second angle formed by a boundary between the high refractive index region and the low refractive index region of the second anisotropic diffusion layer and the direction perpendicular to the substrate.

DETAILED DESCRIPTION

Figure 1:
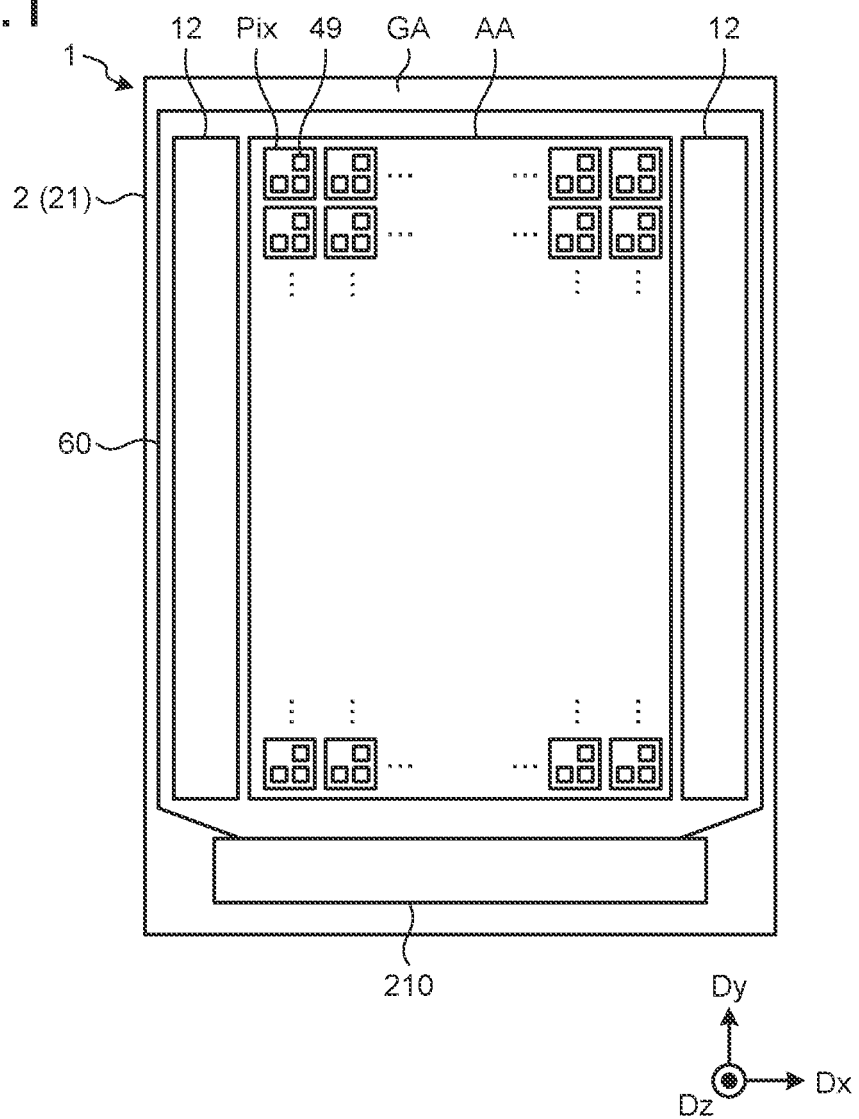
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by the same reference numerals, and detailed explanation thereof may be appropriately omitted.

In the present specification and the accompanying claims, to express an aspect where a first structure is disposed on a second structure, the term "on" includes both of the following cases if not specially defined: the case where the first structure is disposed directly on the second structure so as to be in contact with the second structure and the case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a light emission control scanning line BG, a reset control scanning line RG, an initialization control scanning line IG, and a writing control scanning line SG (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as a chip-on-glass (COG) IC. The mounting form of the drive IC 210 is not limited thereto, and the drive IC 210 may be mounted on FPCs or a rigid substrate coupled to the peripheral region GA of the substrate 21 as a chip-on-film (COF) IC.

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light emitting elements 3 are electrically coupled to the common cathode wiring 60 and supplied with a fixed potential (e.g., a ground potential). More specifically, a cathode terminal 32 (refer to FIG. 5) of the light emitting element 3 is coupled to the cathode wiring 60 via a cathode electrode 22.

Figure 2:
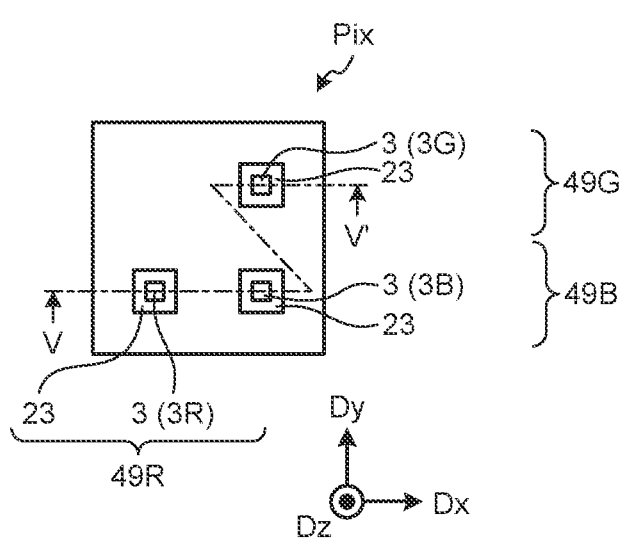
FIG. 2 is a plan view of a plurality of sub-pixels.

FIG. 2 is a plan view of a plurality of sub-pixels. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays a primary color of red as the first color. The second sub-pixel 49G displays a primary color of green as the second color. The third sub-pixel 49B displays a primary color of blue as the third color. As illustrated in FIG. 2, the first sub-pixel 49R and the third sub-pixel 49B in one pixel Pix are aligned in the first direction Dx. The second sub-pixel 49G and the third sub-pixel 49B are aligned in the second direction Dy. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as sub-pixels 49 when they need not be distinguished from one another.

The sub-pixels 49 each include the light emitting element 3 and an anode electrode 23. The display device 1 displays an image by emitting different light (e.g., red, green, and blue light) from light emitting elements 3R, 3G, and 3B in the first sub-pixel 49R, the second sub-pixel 49G, and the third sub-pixel 49B, respectively. The light emitting elements 3 are provided in the respective sub-pixels 49. The light emitting element 3 is a light emitting diode (LED) chip having a size of approximately 3 μm to 300 μm in planar view. An LED chip having a chip size smaller than 100 μm is called a micro LED, which is not strictly defined. The display device 1 including the micro LEDs in the respective pixels is also called a micro LED display device. The term "micro" of the micro LED is not intended to limit the size of the light emitting element 3.

The light emitting elements 3 may emit different light in four or more colors. The positions of the sub-pixels 49 are not limited to the configuration illustrated in FIG. 2. The first sub-pixel 49R, for example, may be adjacent to the second sub-pixel 49G in the first direction Dx. The first sub-pixel 49R, the second sub-pixel 49G, and the third sub-pixel 49B may be repeatedly arrayed in this order in the first direction Dx.

Figure 3:
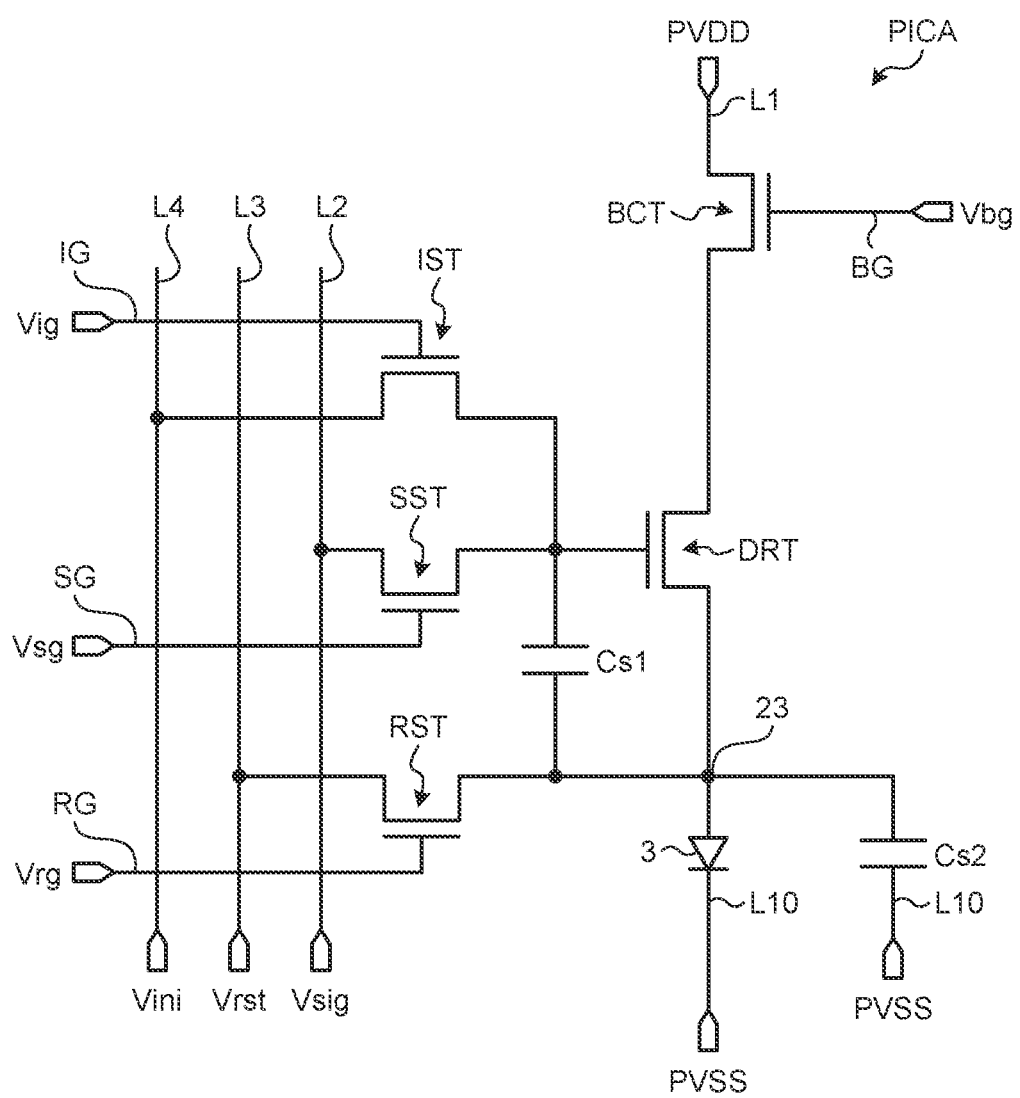
FIG. 3 is a circuit diagram of a pixel circuit.

FIG. 3 is a circuit diagram of a pixel circuit. A pixel circuit PICA illustrated in FIG. 3 is provided to each of the first sub-pixel 49R, the second sub-pixel 49G, and the third sub-pixel 49B. The pixel circuit PICA is provided on the substrate 21 to supply a drive signal (electric current) to the light emitting element 3. The explanation of the pixel circuit PICA with reference to FIG. 3 is applicable to the respective pixel circuits PICA included in the first sub-pixel 49R, the second sub-pixel 49G, and the third sub-pixel 49B.

As illustrated in FIG. 3, the pixel circuit PICA includes the light emitting element 3, five transistors, and two capacitances. Specifically, the pixel circuit PICA includes a light emission control transistor BCT, an initialization transistor IST, a writing transistor SST, a reset transistor RST, and a drive transistor DRT. Some of the transistors may be shared by adjacent sub-pixels 49 of the sub-pixels 49. The light emission control transistor BCT, for example, may be shared by three sub-pixels 49 via common wiring. The reset transistors RST may be provided in the peripheral region GA and provided for respective rows of the sub-pixels 49, for example. In this case, the reset transistor RST is coupled to the sources of a plurality of drive transistors DRT via common wiring.

The transistors included in the pixel circuit PICA are n-type thin film transistors (TFTs). The present embodiment is not limited thereto, and the transistors may be p-type TFTs. To use p-type TFTs, the coupling form of power supply potential, capacitance Cs1, and capacitance Cs2 may be appropriately adapted.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST.

The light emission control scanning line BG, the initialization control scanning line IG, the writing control scanning line SG, and the reset control scanning line RG are coupled to the drive circuits 12 (refer to FIG. 1) provided in the peripheral region GA. The drive circuits 12 supply a light emission control signal Vbg, an initialization control signal Vig, a writing control signal Vsg, and a reset control signal Vrg to the light emission control scanning line BG, the initialization control scanning line IG, the writing control scanning line SG, and the reset control scanning line RG, respectively.

The drive IC 210 (refer to FIG. 1) supplies video signals Vsig to the respective pixel circuits PICA of the first sub-pixel 49R, the second sub-pixel 49G, and the third sub-pixel 49B in a time-division manner. A switching circuit, such as a multiplexer, is provided between each row of the first sub-pixels 49R, the second sub-pixels 49G, and the third sub-pixels 49B and the drive IC 210. The video signal Vsig is supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, and the reset transistor RST each function as a switching element that selects electrical continuity and discontinuity between two nodes. The drive transistor DRT functions as an electric current control element that controls an electric current flowing through the light emitting element 3 depending on voltage between the gate and the drain.

The cathode (cathode terminal 32) of the light emitting element 3 is coupled to a cathode power supply line L10. The anode (anode terminal 33) of the light emitting element 3 is coupled to an anode power supply line L1 via the drive transistor DRT and the light emission control transistor BCT. The anode power supply line L1 is supplied with anode power supply potential PVDD. The cathode power supply line L10 is supplied with cathode power supply potential PVSS. The anode power supply potential PVDD is higher than the cathode power supply potential PVSS. The cathode power supply line L10 includes the cathode wiring 60. Light emission operations of the light emitting element 3 will be described later.

The pixel circuit PICA includes the capacitance Cs1 and the capacitance Cs2. The capacitance Cs1 is holding capacitance formed between the gate and the source of the drive transistor DRT. The capacitance Cs2 is additional capacitance formed between the cathode power supply line L10 and both the source of the drive transistor DRT and the anode of the light emitting element 3.

Figure 4:
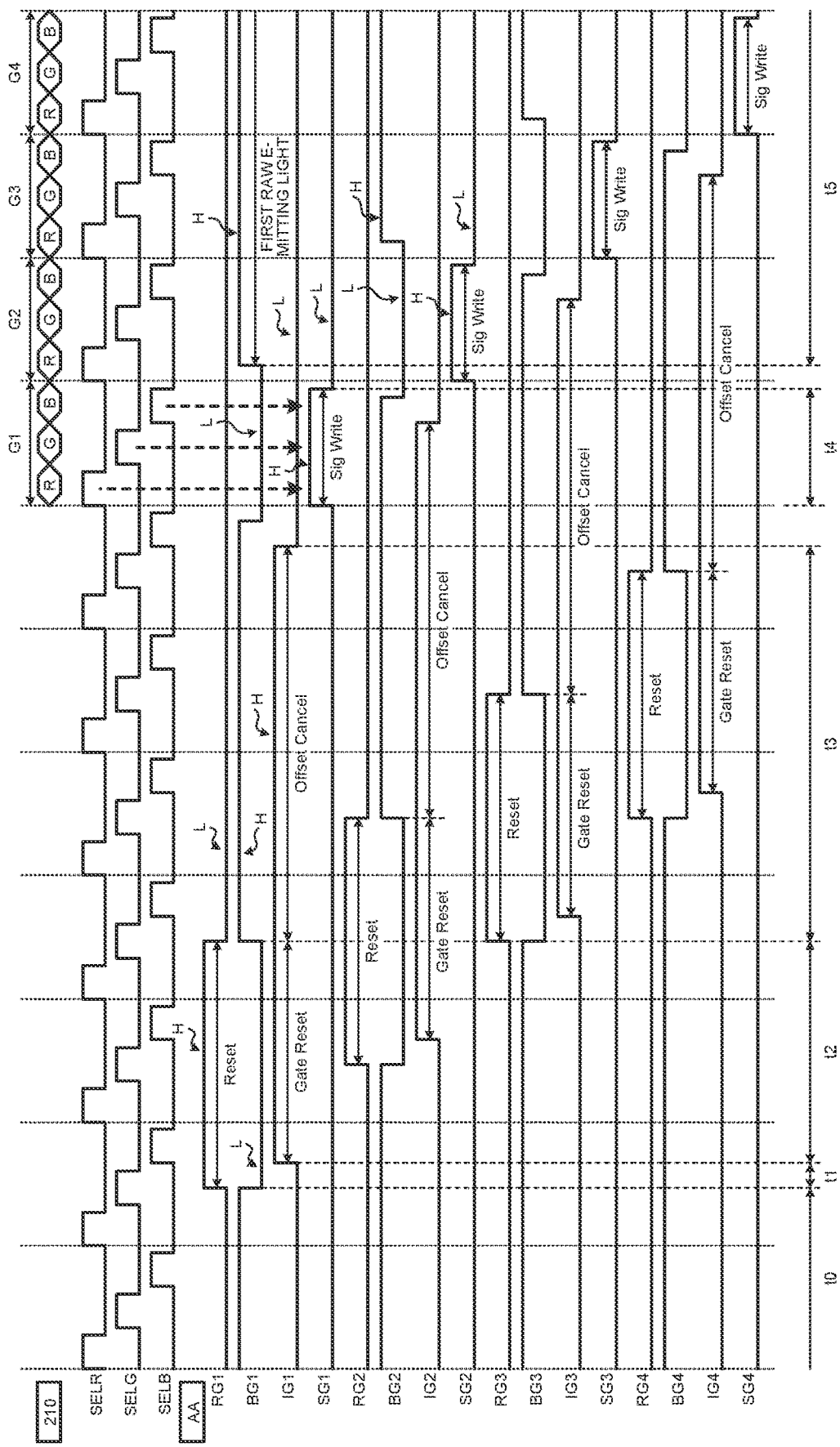
FIG. 4 is a timing chart of exemplary operations of the display device.

FIG. 4 is a timing chart of exemplary operations of the display device. Periods G1 to G4 illustrated in FIG. 4 each correspond to one horizontal period. While FIG. 4 illustrates the operations for driving the sub-pixels 49 of the first row to the sub-pixels 49 of the fourth row, the sub-pixels 49 of the fifth row to the sub-pixels 49 of the last row are subsequently driven. In the following description, a frame period 1F indicates the period for driving the sub-pixels 49 of the first row to the sub-pixels 49 of the last row.

The following describes exemplary operations from period t0 to period t5 illustrated in FIG. 4 in greater detail. The period t0 is a pervious frame light emission period. In other words, in the period t0 before processing in a certain frame period 1F is started, the sub-pixels 49 maintain the light emission state of the previous frame.

The subsequent period t1 is a source initialization period for the drive transistor DRT. Specifically, in the period t1, the electric potential of a light emission control scanning line BG1 is switched to an L (low) level, and the electric potential of a reset control scanning line RG1 is switched to an H (high) level by the control signals supplied from the drive circuits 12. As a result, the light emission control transistor BCT is turned off (electrically discontinuous state), and the reset transistor RST is turned on (electrically continuous state).

The light emission control scanning line BG1 indicates the light emission control scanning line BG coupled to the sub-pixels 49 of the first row. A light emission control scanning line BG2 indicates the light emission control scanning line BG coupled to the sub-pixels 49 of the second row. A light emission control scanning line BG3 indicates the light emission control scanning line BG coupled to the sub-pixels 49 of the third row. A light emission control scanning line BG4 indicates the light emission control scanning line BG coupled to the sub-pixels 49 of the fourth row. Similarly, other scanning lines, such as the reset control scanning lines RG1, RG2, RG3, and RG4, indicate the scanning lines of the respective rows.

In the period t1, an electric current from the anode power source line L1 is cut off by the light emission control transistor BCT in the sub-pixels 49 of the first row. Light emission from the light emitting elements 3 stops, and residual electric charges in the sub-pixels 49 flow outside through the reset transistor RST. As a result, the electric potential of the source of the drive transistor DRT is fixed at the reset power supply potential Vrst. The reset power supply potential Vrst is set so as to have a predetermined potential difference with respect to the cathode power supply potential PVSS. In this case, the potential difference between the reset power supply potential Vrst and the cathode power supply potential PVSS is smaller than the potential difference at which the light emitting element 3 starts to emit light.

The subsequent period t2 is a gate initialization period for the drive transistor DRT. Specifically, in the period t2, the electric potential of an initialization control scanning line IG1 is switched to the H level by the control signals supplied from the drive circuits 12. The initialization transistor IST is turned on. In the sub-pixels 49 belonging to the first row, the electric potential of the gate of the drive transistor DRT is fixed at the initialization potential *Vini* by the initialization transistor IST. The initialization potential *Vini* has an electric potential higher than a threshold of the drive transistor DRT with respect to the reset power supply potential Vrst. As a result, the drive transistor DRT is turned on. In the period t2, no electric current flows through the drive transistor DRT because the light emission control transistor BCT remains off.

The subsequent period t3 is an offset cancel operation period. Specifically, in the period t3, the electric potential of the light emission control scanning line BG1 is switched to the H level, and the electric potential of the reset control scanning line RG1 is switched to the L level by the control signals supplied from the drive circuits 12. As a result, the light emission control transistor BCT is turned on, and the reset transistor RST is turned off.

The drive transistor DRT is in the ON state by the operations performed in the period t2. As a result, an electric current is supplied to the drive transistor DRT from the anode power supply line L1 (anode power supply potential PVDD) via the light emission control transistor BCT.

At this stage, no electric current flows because voltage between the anode and the cathode of the light emitting element 3 is lower than light emission start voltage. Consequently, the source of the drive transistor DRT is charged by the anode power supply potential PVDD, whereby the electric potential of the source increases. The gate potential of the drive transistor DRT is the initialization potential Vini. When the source potential of the drive transistor DRT is equal to (Vini−Vth), the drive transistor DRT is turned off, and the increase in the electric potential stops. Vth indicates a threshold voltage Vth for the drive transistor DRT.

The threshold voltage Vth varies depending on the sub-pixels 49. Consequently, the source potential of the drive transistor DRT when the increase in the electric potential stops varies depending on the sub-pixels 49. In other words, a voltage corresponding to the threshold voltage Vth of the drive transistor DRT is obtained in each of the sub-pixels 49 by the operations performed in the period t3. At this time, the light emitting element 3 is supplied with a voltage of ((Vini−Vth)−PVSS). No electric current flows through the light emitting element 3 because this voltage is lower than the light emission start voltage of the light emitting element 3.

The subsequent period t4 is a video signal writing operation period. Specifically, in the period t4, the electric potential of the light emission control scanning line BG1 is switched to the L level, the electric potential of the initialization control scanning line IG1 is switched to the L level, and the electric potential of a writing control scanning line SG1 is switched to the H level by the control signals supplied from the drive circuits 12.

As a result, the light emission control transistor BCT is turned off, the initialization transistor IST is turned off, and the writing transistor SST is turned on. In the period t4, the video signals Vsig are input to the gates of the drive transistors DRT in the sub-pixels 49 belonging to the first row. The gate potential of the drive transistor DRT changes from the initialization potential Vini to the electric potential of the video signal Vsig. By contrast, the source potential of the drive transistor DRT remains at (Vini−Vth). As a result, the voltage between the gate and the source of the drive transistor DRT is equal to (Vsig−(Vini−Vth)) and reflects variations in the threshold voltage Vth between the sub-pixels 49.

The video signal line L2 extends in the second direction Dy (refer to FIG. 1) and is coupled to the sub-pixels 49 of a plurality of rows belonging to the same column. Consequently, the period t4 for performing the video writing operation is carried out row by row.

The subsequent period t5 is a light emission operation period. Specifically, in the period t5, the electric potential of the light emission control scanning line BG1 is switched to the H level, and the electric potential of the writing control scanning line SG1 is switched to the L level by the control signals supplied from the drive circuits 12. As a result, the light emission control transistor BCT is turned on, and the writing transistor SST is turned off. An electric current is supplied to the drive transistor DRT from the anode power supply line L1 (anode power supply potential PVDD) via the light emission control transistor BCT.

The drive transistor DRT supplies, to the light emitting element 3, an electric current corresponding to the voltage between the gate and the source set until the period t4. The light emitting element 3 emits light at the luminance corresponding to the electric current. At this time, the voltage between the anode and the cathode of the light emitting element 3 is a voltage corresponding to the value of the voltage supplied via the drive transistor DRT. As a result, the electric potential of the anode of the light emitting element 3 increases. The voltage between the gate and the source of the drive transistor DRT is held by the capacitance Cs1. Consequently, the gate potential of the drive transistor DRT also increases in association with the increase in the electric potential of the anode of the light emitting element 3 due to coupling of the capacitance Cs1.

In an actual operation, the increase in the gate potential of the drive transistor DRT is slightly smaller than the increase in the electric potential of the anode because additional capacitance, such as the capacitance Cs2, is present in the gate of the drive transistor DRT besides the capacitance Cs1. Because this value is already known, the electric potential of the video signal Vsig can be determined so as to obtain a desired current value at the final voltage between the gate and the source of the drive transistor DRT.

After the operations described above are completed from the first row to the last row, an image of one frame is displayed. The reset operation for the sub-pixels 49 belonging to the second row is performed in a period overlapping the periods t2 and t3. The offset cancel operation for the sub-pixels 49 belonging to the second row is performed in a period overlapping the periods t3 and t4. The video signal writing operation for the sub-pixels 49 belonging to the second row is performed in a period overlapping the period t5. Subsequently, the operations described above are repeated, thereby displaying video.

While the sub-pixels 49 of one row are driven from the period t1 to the period t5 in the exemplary operations illustrated in FIG. 4, the present embodiment is not limited thereto. The drive circuits 12 may simultaneously drive the sub-pixels 49 of two rows or three or more rows.

The configuration of the pixel circuit PICA illustrated in FIG. 3 and the exemplary operations illustrated in FIG. 4 are given by way of example only and may be appropriately modified. The number of wiring lines and the number of transistors in one sub-pixel 49, for example, may be different from those described above. The pixel circuit PICA may have a configuration of a current mirror circuit, for example.

Figure 5:
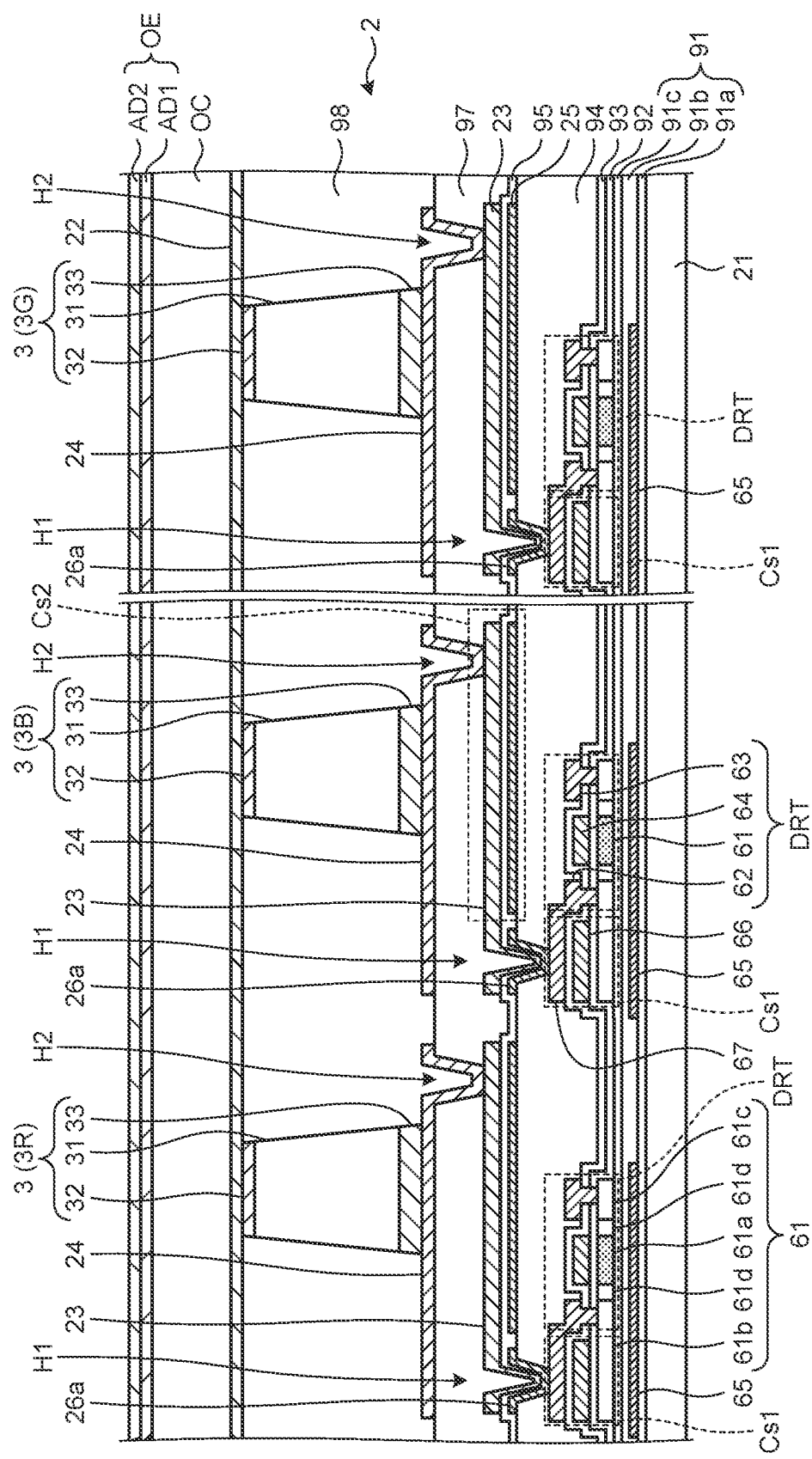
FIG. 5 is a sectional view along line V-V of FIG. 2.

The following describes a sectional configuration of the display device 1. FIG. 5 is a sectional view along line V-V of FIG. 2. As illustrated in FIG. 5, the light emitting elements 3 are provided on the array substrate 2. The array substrate 2 includes the substrate 21, the anode electrodes 23, mounting electrodes 24, counter electrodes 25, coupling electrodes 26a, various transistors, various kinds of wiring, and various insulating films.

The substrate 21 is an insulating substrate and is a glass substrate made of quartz or non-alkali glass or a resin substrate made of polyimide, for example. If the substrate 21 is a flexible resin substrate, the display device 1 may be provided as a sheet display. The substrate 21 is not necessarily made of polyimide and may be made of other resin materials.

In the following descriptions, the direction from the substrate 21 toward the light emitting element 3 in the direction perpendicular to the surface of the substrate 21 is referred to as "on the upper side" or simply as "on". The direction from the light emitting element 3 toward the substrate 21 is referred to as "on the lower side" or simply as "under".

An undercoat film 91 is provided on the substrate 21. The undercoat film 91 has a three-layered structure including insulating films 91a, 91b, and 91c, for example. The insulating film 91a is a silicon oxide film, the insulating film 91b is a silicon nitride film, and the insulating film 91c is a silicon oxide film. The lower insulating film 91a is provided to improve adhesion between the substrate 21 and the undercoat film 91. The middle insulating film 91b is provided as a block film that restrains water and impurities from entering from outside. The upper insulating film 91c is provided as a block film that restrains hydrogen atoms contained in the silicon nitride film of the insulating film 91b from diffusing toward a semiconductor layer 61.

The structure of the undercoat film 91 is not limited to that illustrated in FIG. 5. The undercoat film 91 may be a single-layered film or a two-layered film, for example, or may be a multilayered film having four or more layers. If the substrate 21 is a glass substrate, the silicon nitride film may be formed directly on the substrate 21 because silicon nitride films have relatively high adhesion.

A light shielding film 65 is provided on the insulating film 91a. The light shielding film 65 is provided between the semiconductor layer 61 and the substrate 21. The light shielding film 65 can restrain light from entering into a channel region 61a of the semiconductor layer 61 from the substrate 21. Alternatively, the light shielding film 65 may be made of conductive material and supplied with a predetermined electric potential. As a result, the light shielding film 65 may have a back-gate effect on a drive transistor DRT. The light shielding film 65 may be provided on the substrate 21, and the insulating film 91a may be provided covering the light shielding film 65.

The drive transistor DRT is provided on the undercoat film 91. While the drive transistor DRT out of the transistors is illustrated in FIG. 5, the light emission control transistor BCT, the initialization transistor IST, the writing transistor SST, and the reset transistor RST included in the pixel circuit PICA also have the same multilayered structure as that of the drive transistor DRT.

The drive transistor DRT includes the semiconductor layer 61, a source electrode 62, a drain electrode 63, and a gate electrode 64. The semiconductor layer 61 is provided on the undercoat film 91. The semiconductor layer 61 is made of polysilicon, for example. The material of the semiconductor layer 61 is not limited thereto, and the semiconductor layer 61 may be made of a microcrystalline oxide semiconductor, an amorphous oxide semiconductor, or low-temperature polysilicon, for example. While only an n-type TFT is provided as the drive transistor DRT, a p-type TFT may be formed in addition to the n-type TFT. In the n-type TFT, the semiconductor layer 61 includes a channel region 61a, a source region 61b, a drain region 61c, and a low-concentration impurity region 61d. The low-concentration impurity region 61d is provided between the channel region 61a and the source region 61b and between the channel region 61a and the drain region 61c.

A gate insulating film 92 is provided on the undercoat film 91 to cover the semiconductor layer 61. The gate insulating film 92 is a silicon oxide film, for example. The gate electrode 64 is provided on the gate insulating film 92. First wiring 66 is provided in the same layer as the gate electrode 64. The gate electrode 64 and the first wiring 66 are made of molybdenum tungsten (MoW), for example. While the drive transistor DRT in the example illustrated in FIG. 5 has a top-gate structure in which the gate electrode 64 is provided on the upper side of the semiconductor layer 61, the structure of the drive transistor DRT is not limited thereto. The drive transistor DRT may have a bottom-gate structure in which the gate electrode 64 is provided on the lower side of the semiconductor layer 61 or a dual-gate structure in which the gate electrodes 64 are provided on both the upper side and the lower side of the semiconductor layer 61.

An interlayer insulating film 93 is provided on the gate insulating film 92 to cover the gate electrode 64. The interlayer insulating film 93 has a multilayered structure of a silicon nitride film and a silicon oxide film, for example. The source electrode 62 and the drain electrode 63 are provided on the interlayer insulating film 93. The source electrode 62 is coupled to the source region 61b through a contact hole formed in the gate insulating film 92 and the interlayer insulating film 93. The drain electrode 63 is coupled to the drain region 61c through a contact hole formed in the gate insulating film 92 and the interlayer insulating film 93. The source electrode 62 is coupled to second wiring 67 serving as routing wiring. The source electrode 62, the drain electrode 63, and the second wiring 67 may have a three-layered structure of titanium (Ti), aluminum (Al), and titanium (Ti), for example.

Part of the second wiring 67 is provided in a region overlapping the first wiring 66. The first wiring 66 and the second wiring 67 facing each other with the interlayer insulating film 93 interposed therebetween form capacitance Cs1. The first wiring 66 is provided in a region overlapping part of the semiconductor layer 61. The capacitance Cs1 includes capacitance formed by the semiconductor layer 61 and the first wiring 66 facing each other with the gate insulating film 92 interposed therebetween.

A first flattening film 94 is provided on the interlayer insulating film 93 to cover the drive transistor DRT and the second wiring 67. The first flattening film 94 is made of organic material, such as photosensitive acrylic. Organic material, such as photosensitive acrylic, is excellent in coverage property for difference in level of wiring as well as in surface flatness, compared with inorganic insulating material formed by CVD, for example.

The counter electrode 25, a capacitance insulating film 95, and the anode electrode 23 are layered in the order as listed, on the first flattening film 94. The counter electrode 25 is made of translucent conductive material, such as indium tin oxide (ITO). The coupling electrode 26a is provided in the same layer as the counter electrode 25. The coupling electrode 26a is provided covering the inside of a contact hole H1 formed in the first flattening film 94 and is coupled to the second wiring 67 at the bottom of the contact hole H1.

The capacitance insulating film 95 is provided covering the counter electrode 25 and the coupling electrode 26a and has an opening in a region overlapping the contact hole H1. The capacitance insulating film 95 is a silicon nitride film, for example. The anode electrode 23 faces the counter electrode 25 with the capacitance insulating film 95 interposed therebetween. The anode electrode 23 is electrically coupled to the coupling electrode 26a and the second wiring 67 through the contact hole H1. As a result, the anode electrode 23 is electrically coupled to the drive transistor DRT. The anode electrode 23 has a multilayered structure of Ti and Al. The material of the anode electrode 23 is not limited thereto, and the anode electrode 23 may be made of material including at least one of metals of Mo and Ti.

Alternatively, the anode electrode 23 may be made of alloy including at least one of Mo and Ti or translucent conductive material.

Capacitance Cs2 is formed between the anode electrode 23 and the counter electrode 25 facing each other with the capacitance insulating film 95 interposed therebetween. The counter electrode 25 made of ITO also serves as a barrier film that protects various kinds of wiring, such as the second wiring 67, in forming the anode electrode 23. In patterning the anode electrode 23, the counter electrode 25 is partially exposed to etching environment. By annealing performed between formation of the counter electrode 25 and formation of the anode electrode 23, the counter electrode 25 has sufficient resistance to etching for the anode electrode 23.

A second flattening film 97 is provided on the anode electrode 23. The second flattening film 97 has a contact hole H2 reaching the anode electrode 23. The mounting electrode 24 is provided on the second flattening film 97 and electrically coupled to the anode electrode 23 through the contact hole H2. The mounting electrode 24 has a multilayered structure of Ti and Al like the anode electrode 23. The mounting electrode 24 may be made of conductive material different from that of the anode electrode 23.

The light emitting elements 3R, 3G, and 3B are mounted on the respective mounting electrodes 24. The light emitting elements 3 are each mounted such that the anode terminal 33 is in contact with the mounting electrode 24. Connection between the anode terminal 33 of the light emitting element 3 and the mounting electrode 24 is not particularly restricted as long as the connection can secure excellent electrical continuity between the anode terminal 33 and the mounting electrode 24 and does not damage objects formed on the array substrate 2. Examples of the method for connecting the anode terminal 33 and the mounting electrode 24 include, but are not limited to, reflowing using low-temperature melting soldering material, a method of placing the light emitting element 3 on the array substrate 2 with conductive paste interposed therebetween and burning and bonding them, etc.

The light emitting element 3 may be mounted directly on the anode electrode 23 without the second flattening film 97 or the mounting electrode 24 on the array substrate 2. Providing the second flattening film 97 and the mounting electrode 24 can restrain the capacitance insulating film 95 from being damaged by force applied in mounting the light emitting element 3. In other words, the second flattening film 97 and the mounting electrode 24 can restrain dielectric breakdown that would otherwise be caused between the anode electrode 23 and the counter electrode 25 that form the capacitance Cs2.

The light emitting element 3 includes a semiconductor layer 31, the cathode terminal 32, and the anode terminal 33. The semiconductor layer 31 is made of a compound semiconductor, such as gallium nitride (GaN) and aluminum indium phosphorous (AlInP). The semiconductor layer 31 may be made of different materials between the light emitting elements 3R, 3G, and 3B. The active layer may have a multi-quantum well structure (MQW structure) in which well layers and barrier layers composed of several atomic layers are cyclically layered for high efficiency. The semiconductor layer 31 may be formed on a semiconductor substrate as the light emitting element 3. The light emitting element 3 is not necessarily mounted alone on the array substrate 2, and an LED chip including the light emitting element 3 may be mounted on the array substrate 2.

An element insulating film 98 is provided between the plurality of light emitting elements 3. The element insulating film 98 is made of resin material. The element insulating film 98 covers the side surfaces of each light emitting element 3, and the cathode terminal 32 of the light emitting element 3 is exposed from the element insulating film 98. The element insulating film 98 is flattened such that the upper surface of the element insulating film 98 and the upper surface of the cathode terminal 32 form a single plane. The position of the upper surface of the element insulating film 98 may be different from that of the upper surface of the cathode terminal 32.

The cathode electrode 22 covers the plurality of light emitting elements 3 and the element insulating film 98 and is electrically coupled to the light emitting elements 3. More specifically, the cathode electrode 22 is provided across the upper surface of the element insulating film 98 and the upper surface of the cathode terminal 32. The cathode electrode 22 is made of translucent conductive material, such as ITO. With this configuration, the light emitted from the light emitting elements 3 can be efficiently extracted to the outside. The cathode electrode 22 is electrically coupled to the cathode terminals 32 of the light emitting elements 3 mounted on the display region AA. The cathode electrode 22 is coupled to the cathode wiring 60 provided on the array substrate 2, at a cathode contact portion provided outside the display region AA.

An overcoat layer OC and an optical member OE are layered on the cathode electrode 22. The overcoat layer OC is a multilayered structure of a silicon nitride film having a thickness of 200 nm and an organic insulating film having a thickness of 10 μm. The optical member OE is an optical functional layer that scatters light emitted from the light emitting element 3 to shift the direction of the maximum of light emission distribution in the third direction Dz. The optical member OE includes a first anisotropic diffusion layer AD1 and a second anisotropic diffusion layer AD2. The first anisotropic diffusion layer AD1 faces the substrate 21 (array substrate 2) with the plurality of light emitting elements 3 interposed therebetween. The second anisotropic diffusion layer AD2 is layered on the first anisotropic diffusion layer AD1. The configuration of the optical member OE will be described later in greater detail.

Figure 6:
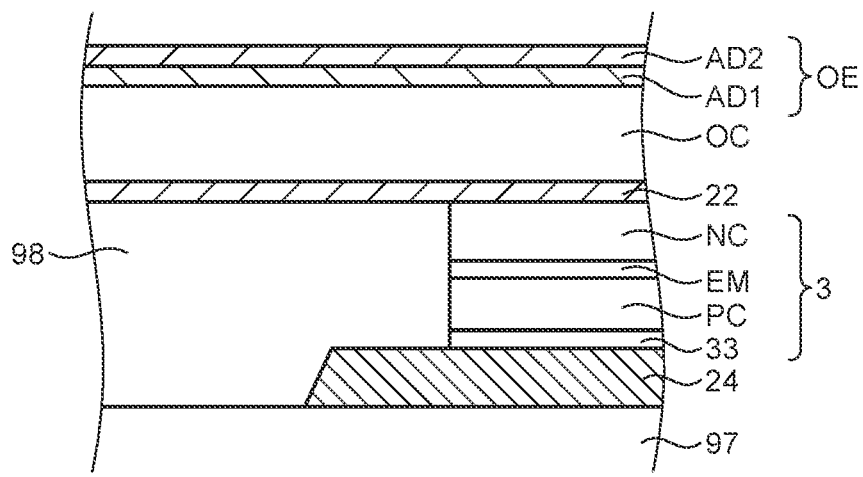
FIG. 6 is a partially enlarged sectional view of a light emitting element illustrated in FIG. 5.

FIG. 6 is a partially enlarged sectional view of the light emitting element illustrated in FIG. 5. As illustrated in FIG. 6, the light emitting element 3 includes an n-type clad layer NC, a light emission layer EM, a p-type clad layer PC, and the anode terminal 33. The p-type clad layer PC, the light emission layer EM, and the n-type clad layer NC are layered in this order on the anode terminal 33. The anode terminal 33 is provided between the p-type clad layer PC and the mounting electrode 24.

In the light emitting element 3B that emits blue light, the light emission layer EM is made of indium gallium nitride (InGaN). The composition ratio of indium to gallium is 0.2:0.8, for example. The p-type clad layer PC and the n-type clad layer NC are made of gallium nitride (GaN).

In the light emitting element 3G that emits green light, the light emission layer EM is made of indium gallium nitride (InGaN). The composition ratio of indium to gallium is 0.45:0.55, for example. The p-type clad layer PC and the n-type clad layer NC are made of gallium nitride (GaN).

In the light emitting element 3R that emits red light, the light emission layer EM is made of aluminum gallium indium (AlGaIn). The composition ratio among aluminum, gallium, and indium is 0.225:0.275:0.5, for example. The p-type clad layer PC and the n-type clad layer NC are made of aluminum indium phosphide (AlInP).

The anode terminals 33 of the light emitting elements 3R, 3G, and 3B are made of aluminum. The maximum emission wavelengths of the light emitting elements 3R, 3G, and 3B are 645 nm, 530 nm, and 450 nm, respectively.

As described above, the display device 1 with the light emitting elements 3 serving as display elements is provided. The display device 1 may include a circularly polarizing plate, a cover glass, a touch panel, and other components on the upper sides of the cathode electrode 22 and the optical member OE as needed. In this case, a filler made of resin or the like may be provided between the display device 1 and the member, such as a cover glass. The display device 1 does not necessarily have a face-up structure in which the upper part of the light emitting element 3 is coupled to the cathode electrode 22. The display device 1 may have what is called a face-down structure in which the lower part of the light emitting element 3 is coupled to the anode electrode 23 and the cathode electrode 22.

The following describes distribution of light emitted from the light emitting element 3. A refractive index $n_{LED}$ of the light emitting element 3 is 2.4, for example. A refractive index $n_{CD}$ of the cathode electrode 22 disposed close to the upper part of the light emitting element 3 is 1.9, for example. A refractive index $n_{DC}$ of the overcoat layer OC is 1.5, for example. The refractive indexes $n_{CD}$ and $n_{DC}$ are lower than the refractive index $n_{LED}$. As a result, the traveling direction of light emitted from the light emitting element 3 is directed in an oblique direction inclining with respect to the third direction Dz when the light is passing through the cathode electrode 22 and the overcoat layer OC. The component of light having a large incident angle may possibly be totally reflected on the interface between the light emitting element 3 and the cathode electrode 22 and travel in a direction parallel to the array substrate 2.

Figure 19:
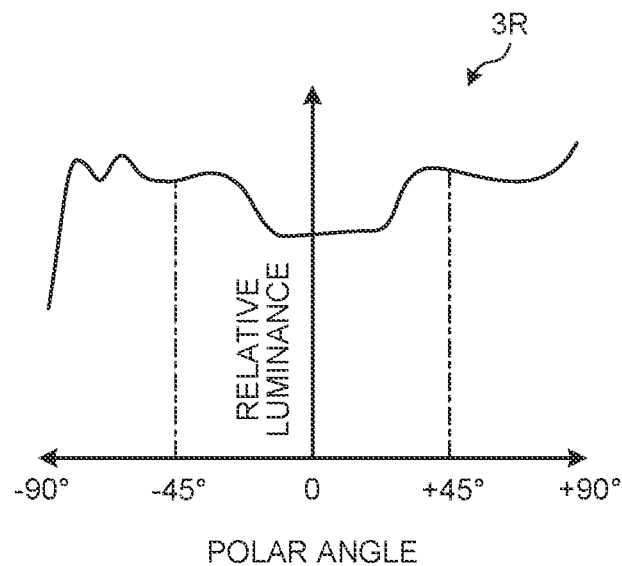
FIG. 19 is a graph schematically illustrating a relation between the relative luminance of light from a light emitting element that emits red light and the polar angle.
Figure 20:
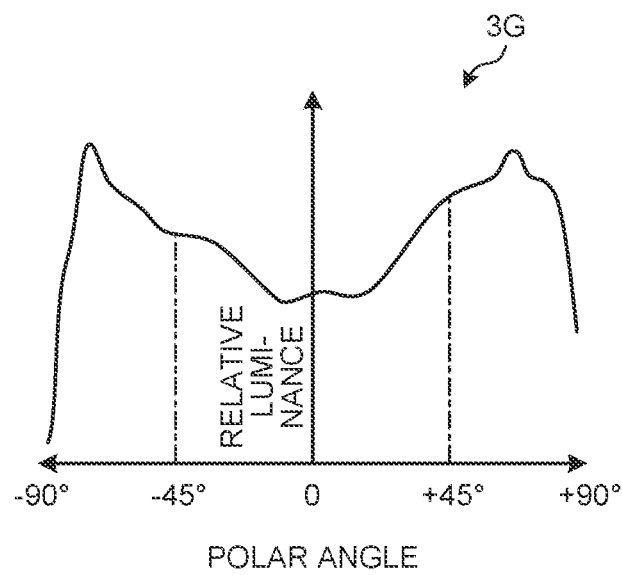
FIG. 20 is a graph schematically illustrating a relation between the relative luminance of light from a light emitting element that emits green light and the polar angle.
Figure 21:
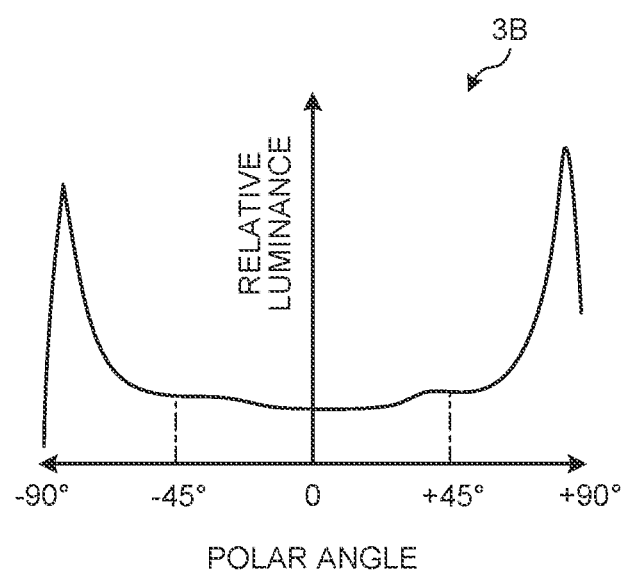
FIG. 21 is a graph schematically illustrating a relation between the relative luminance of light from a light emitting element that emits blue light and the polar angle.

FIG. 19 is a graph schematically illustrating a relation between the relative luminance of light from the light emitting element that emits red light and the polar angle. FIG. 20 is a graph schematically illustrating a relation between the relative luminance of light from the light emitting element that emits green light and the polar angle. FIG. 21 is a graph schematically illustrating a relation between the relative luminance of light from the light emitting element that emits blue light and the polar angle.

The graphs illustrated in FIGS. 19 to 21 indicate the light emission properties of light emitting elements 3R, 3G, and 3B in a display device according to a comparative example not provided with the optical member OE. The abscissas of the graphs illustrated in FIGS. 19 to 21 indicate the polar angle, that is, the inclination angle with respect to the third direction Dz. The ordinates of the graphs indicate the relative luminance of light emitted from the respective light emitting elements 3R, 3G, and 3B.

As illustrated in FIGS. 19 to 21, none of the light emitting elements 3R, 3G, and 3B has the peak of the relative luminance at a polar angle of 0°, that is, in the third direction Dz. The light emitting elements 3R, 3G, and 3B have the polar angle dependence that the relative luminance is higher at a polar angle of 45° than at a polar angle of 0°, for example. The light emitting elements 3R, 3G, and 3B have different polar angle dependences of relative luminance.

The light emitting element 3R illustrated in FIG. 19, for example, has polar angle dependence relatively broader than those of the light emitting elements 3G and 3B. The difference between the relative luminance at a polar angle of 0° and at a polar angle of 45° in the light emitting element 3R is smaller than the difference between the relative luminance at a polar angle of 0° and at a polar angle of 45° in the light emitting element 3G. As illustrated in FIG. 21, the difference between the relative luminance at a polar angle of 0° and at a polar angle of 45° in the light emitting element 3B is smaller than those in the light emitting elements 3R and 3G. The light emitting element 3B has the peaks of the relative luminance in a direction near the direction of a polar angle of 90°, that is, near the horizontal direction orthogonal to the third direction Dz. As described above, if the optical member OE is not provided, the light emitting element 3 has smaller polar angle dependence or has the peak of relative luminance in a direction of a larger polar angle. The light emission properties of the light emitting elements 3 illustrated in FIGS. 19 to 21 are given by way of example only. FIGS. 19 to 21 illustrate the relative luminance of the light emitting elements 3R, 3G, and 3B, respectively, and do not illustrate the luminance of the light emitting elements 3R, 3G, and 3B in a comparative manner.

Figure 7:
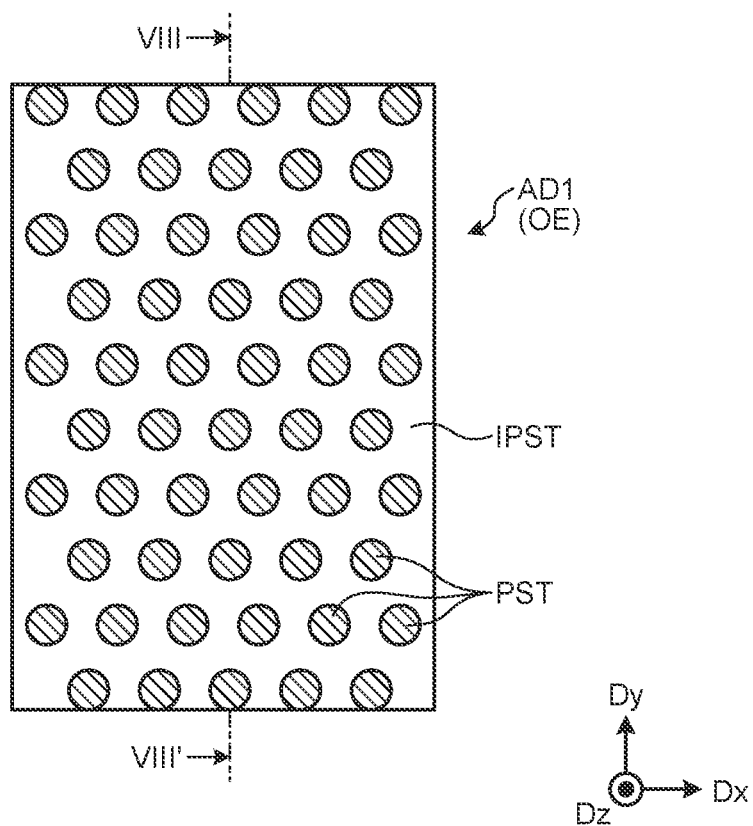
FIG. 7 is a plan view schematically illustrating a first anisotropic diffusion layer included in an optical member according to the first embodiment.
Figure 8:
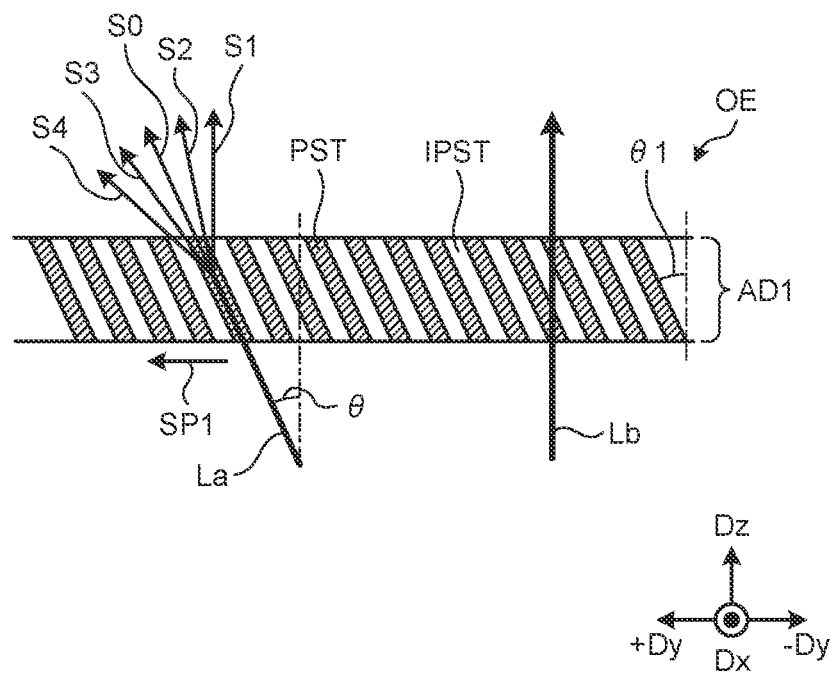
FIG. 8 is a sectional view along line VIII-VIII' of FIG. 7.
Figure 9:
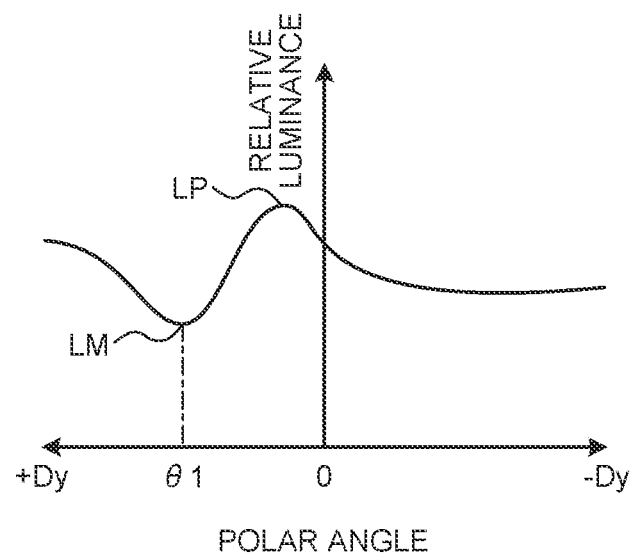
FIG. 9 is a graph schematically illustrating a relation between the relative luminance of light scattered by the first anisotropic diffusion layer and the polar angle.

The following describes the configuration of the optical member OE in greater detail. To facilitate the reader's understanding, FIGS. 7 to 9 illustrate the first anisotropic diffusion layer AD1 serving as one of the anisotropic diffusion layers included in the optical member OE. FIG. 7 is a plan view schematically illustrating the first anisotropic diffusion layer included in the optical member according to the first embodiment.

The first anisotropic diffusion layer AD1 is a sheet member that scatters light. As illustrated in FIG. 7, the first anisotropic diffusion layer AD1 includes first regions PST and a second region IPST. The region, in the in-plane direction, of the first anisotropic diffusion layer AD1 includes the first regions PST (high refractive index regions) and the second region IPST (low refractive index region) in a mixed manner. Specifically, the first regions PST each have a columnar structure, have a circular shape in planar view, and are arrayed away from each other. The second region IPST is provided between the first regions PST in a manner surrounding the first regions PST.

The first region PST and the second region IPST have different refractive indexes. The refractive index of the first region PST is higher than that of the second region IPST. In other words, the first region PST is a high refractive index region, that is, a region having a relatively high refractive index in the first anisotropic diffusion layer AD1. The second region IPST is a low refractive index region, that is, a region having a relatively low refractive index in the first anisotropic diffusion layer AD1.

While the first regions PST are arrayed in a triangular lattice or a hound's-tooth pattern in FIG. 7, the present embodiment is not limited thereto. The first regions PST may be arrayed in a matrix (row-column configuration) or at random.

FIG. 8 is a sectional view along line VIII-VIII' of FIG. 7. As illustrated in FIG. 8, the first regions PST extend inclining in the second direction Dy (+Dy direction) with respect to the third direction Dz. The first anisotropic diffusion layer AD1 has anisotropy for light scattering and has a property of scattering light traveling in a specific incident direction out of incident light. In other words, the first anisotropic diffusion layer AD1 scatters light traveling in an incident direction within a range of approximately ±20° with respect to the extension direction of the first region PST and causes light traveling in an incident direction out of a range of ±20° with respect to the extension direction of the first region PST to pass therethrough.

Specifically, the extension direction of the first region PST inclines with respect to the third direction Dz by 20° or more. When a first angle θ1 is the angle formed by the extension direction of the first region PST and the third direction Dz, θ1>20° is satisfied. Light La parallel to the extension direction of the first region PST is scattered, and light Lb parallel to the third direction Dz is not scattered.

Out of scattered lights S1, S2, S3, and S4 of the light La, the scattered lights S1 and S2 are directed toward a lower polar angle side than a scattering central axis S0, that is, in a direction (−Dy direction) closer to the third direction Dz. By contrast, the scattered lights S3 and S4 are directed toward a higher polar angle side than the scattering central axis S0, that is, in a direction (+Dy direction) away from the third direction Dz. Light of the component of the scattering central axis S0 may be referred to as the maximum of the scattered light components.

The scattering central axis S0 is an axis about which the anisotropic scattering properties of incident light are substantially symmetrical. In other words, the scattering central axis S0 extends in the incident direction of the most scattered light. An angle θ formed by the axial direction of the scattering central axis S0 and the normal direction (third direction Dz) of the surface of the first anisotropic diffusion layer AD1 is referred to as a polar angle of the scattering central axis S0. The scattering central axis S0 inclines with respect to the third direction Dz. In other words, the first region PST inclines with respect to the third direction Dz. An azimuth angle SP1 of the scattering central axis S0 is a direction obtained by projecting the scattering central axis S0 on a plane defined by the first direction Dx and the second direction Dy and is directed in the +Dy direction.

The extension direction of the first region PST according to the first embodiment is parallel to the extension direction of the boundary between the first region PST and the second region IPST. In other words, the angle θ of the scattering central axis S0 is equal to the first angle θ1 of the boundary between the first region PST and the second region IPST. While FIG. 8 is a sectional view of the first anisotropic diffusion layer AD1 cut along a plane defined by the second direction Dy and the third direction Dz, the light La is scattered also in the plane. In other words, when the second direction Dy is an azimuth angle of 0°, the light La is also scattered in the azimuth angle direction.

FIG. 9 is a graph schematically illustrating a relation between the relative luminance of light scattered by the first anisotropic diffusion layer and the polar angle. FIG. 9 illustrates the relative luminance of light obtained when the first anisotropic diffusion layer AD1 is provided at the front surface of the light emitting elements 3 having the light emission distribution properties illustrated in FIGS. 19 to 21. FIG. 9 indicates the polar angle dependence in the azimuth angle direction (second direction Dy) including the extension direction of the first region PST.

As illustrated in FIG. 9, light scattered by the first anisotropic diffusion layer AD1 has the minimum LM and the maximum LP of the relative luminance in the polar angle direction of the +Dy direction in the second direction Dy. The angle indicating the minimum LM is substantially equal to the first angle θ1 (refer to FIG. 8) corresponding to the extension direction of the first region PST. Scattering the light La incident at the first angle θ1 increases the relative luminance at the polar angles around the first angle θ1. The maximum LP is formed by the scattered lights S1 and S2 being directed toward the lower polar angle side than the first angle θ1. Consequently, the first anisotropic diffusion layer AD1 can improve the relative luminance of light in the normal direction of the array substrate 2.

Figure 10:
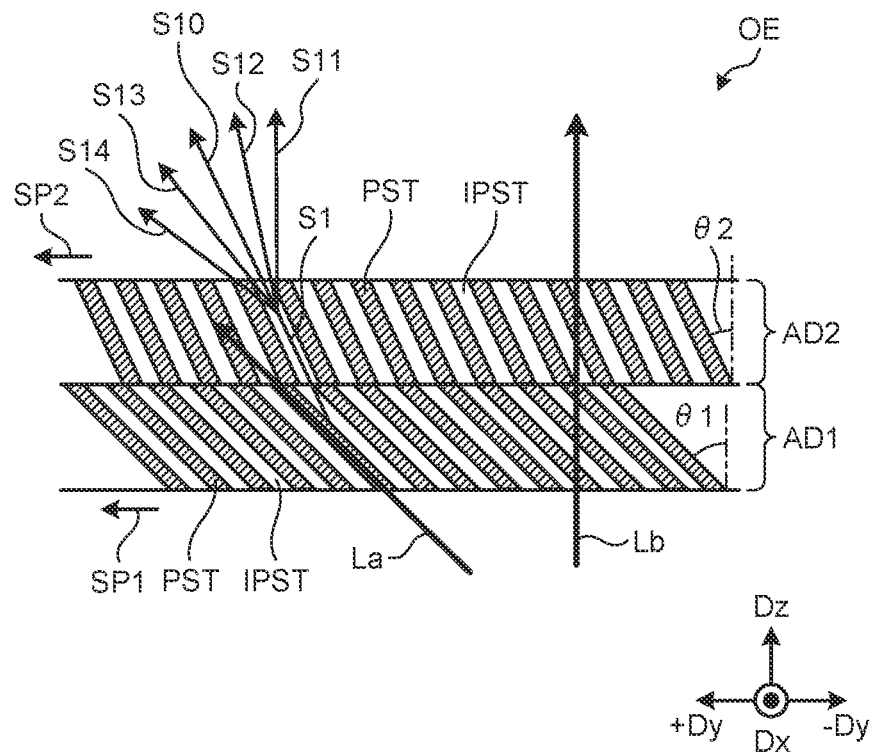
FIG. 10 is a sectional view schematically illustrating the optical member according to the first embodiment.

FIG. 10 is a sectional view schematically illustrating the optical member according to the first embodiment. As illustrated in FIG. 10, the optical member OE includes the first anisotropic diffusion layer AD1 and the second anisotropic diffusion layer AD2. The second anisotropic diffusion layer AD2 is layered on the first anisotropic diffusion layer AD1. More specifically, the first anisotropic diffusion layer AD1 and the second anisotropic diffusion layer AD2 are layered in this order on the upper side of the array substrate 2 in the third direction Dz. The second anisotropic diffusion layer AD2 is provided farther away from the array substrate 2 (substrate 21) than the first anisotropic diffusion layer AD1 is.

As with the first anisotropic diffusion layer AD1, the second anisotropic diffusion layer AD2 includes the first regions PST and the second region IPST. The azimuth angle SP1 (first azimuth angle) of the scattering central axis S0 of light of the first anisotropic diffusion layer AD1 is equal to an azimuth angle SP2 (second azimuth angle) of a scattering central axis S10 of light of the second anisotropic diffusion layer AD2. In other words, both the first region PST (high refractive index region) of the first anisotropic diffusion layer AD1 and the first region PST (high refractive index region) of the second anisotropic diffusion layer AD2 extend inclining in the same direction (+Dy direction) with respect to the third direction Dz. The azimuth angles SP1 and SP2 indicate directions in planar view obtained by projecting the scattering central axes S0 and S10, respectively, on a plane defined by the first direction Dx and the second direction Dy.

A second angle θ2 is the angle formed by the extension direction of the first region PST of the second anisotropic diffusion layer AD2 and the third direction Dz. The second angle θ2 is different from the first angle θ1. More specifically, the absolute value of the first angle θ1 formed by the boundary between the first region PST (high refractive index region) and the second region IPST (low refractive index region) of the first anisotropic diffusion layer AD1 and the third direction Dz is different from the absolute value of the second angle θ2 formed by the boundary between the first region PST (high refractive index region) and the second region IPST (low refractive index region) of the second anisotropic diffusion layer AD2 and the third direction Dz. More preferably, the absolute value of the first angle θ1 is larger than that of the second angle θ2.

The arrangement pitch of the first regions PST of the second anisotropic diffusion layer AD2 in the second direction Dy is smaller than that of the first regions PST of the first anisotropic diffusion layer AD1 in the second direction Dy. The present embodiment is not limited thereto, and the arrangement pitch of the first regions PST of the second anisotropic diffusion layer AD2 may be equal to that of the first regions PST of the first anisotropic diffusion layer AD1.

As described above, the first anisotropic diffusion layer AD1 scatters the incident light La. The following explanation is made focusing on, out of the scattered lights S1, S2, S3, and S4 (refer to FIG. 8) of the light La, the scattered light S1 on the high polar angle side. The scattered light S1 is parallel to the extension direction of the first region PST of the second anisotropic diffusion layer AD2. In other words, the scattered light S1 is scattered by the second anisotropic diffusion layer AD2 because it travels in a direction parallel to the second angle θ2.

The components of the scattered light S1 scattered by the second anisotropic diffusion layer AD2 are referred to as scattered lights S11, S12, S13, and S14. The scattered lights S11 and S12 are directed toward the lower polar angle side than the scattering central axis S10, that is, in a direction (−Dy direction) closer to the third direction Dz. The scattered lights S11 and S12 are directed in a direction substantially parallel to the third direction Dz. By contrast, the scattered lights S13 and S14 are directed toward the higher polar angle side than the scattering central axis S10, that is, in a direction (+Dy direction) away from the third direction Dz.

The second angle θ2 is larger than 20°. Consequently, the light Lb parallel to the third direction Dz passes through the first anisotropic diffusion layer AD1 and is not scattered by the second anisotropic diffusion layer AD2.

Figure 11:
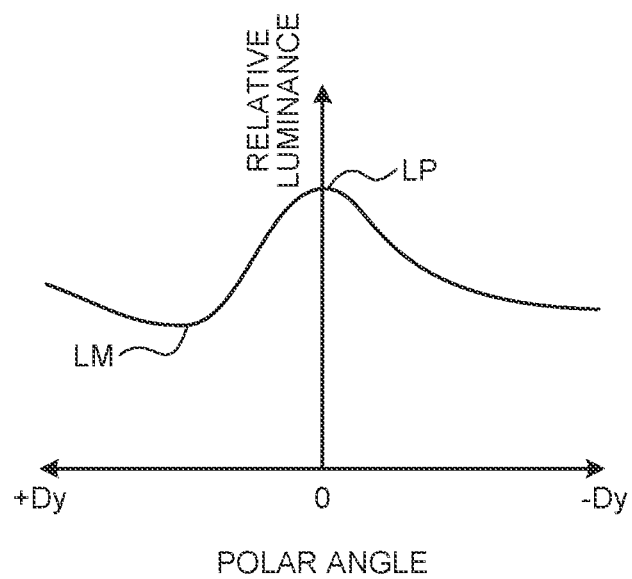
FIG. 11 is a graph schematically illustrating a relation between the relative luminance of light emitted from the display device according to the first embodiment and the polar angle.

FIG. 11 is a graph schematically illustrating a relation between the relative luminance of light emitted from the display device according to the first embodiment and the polar angle. As illustrated in FIG. 11, the maximum LP of the relative luminance of light emitted from the display device 1 is positioned near a polar angle of 0°, that is, near the third direction Dz. The light has the minimum LM in the +Dy direction and the relative luminance of the light decreases on the high polar angle side. In other words, light on the high polar angle side out of the light emitted from the light emitting element 3 is collected by the optical member OE in the third direction Dz. Consequently, the display device 1 can improve the relative luminance in the third direction Dz in which an observer highly frequently observes the display device 1.

As described above, the first angle θ1 of the first anisotropic diffusion layer AD1 according to the present embodiment is different from the second angle θ2 of the second anisotropic diffusion layer AD2. The azimuth angle SP1 of the first region PST of the first anisotropic diffusion layer AD1 is equal to the azimuth angle SP2 of the first region PST of the second anisotropic diffusion layer AD2. As a result, the light diffusion function of the first anisotropic diffusion layer AD1 and the light diffusion function of the second anisotropic diffusion layer AD2 are combined, thereby increasing the light scattering angle of the optical member OE as a whole.

More preferably, the first angle θ1 of the first anisotropic diffusion layer AD1 is larger than the second angle θ2 of the second anisotropic diffusion layer AD2. With this structure, the first anisotropic diffusion layer AD1 can scatter the light La incident at an angle larger than the second angle θ2 and cause part of the components of the light La to be incident on the second anisotropic diffusion layer AD2. The second anisotropic diffusion layer AD2 can further scatter the scattered lights S1 and S2 of the light La. Consequently, the display device of the present embodiment can more effectively direct the incident light in the third direction Dz than in a case where any one of the first anisotropic diffusion layer AD1 and the second anisotropic diffusion layer AD2 is provided.

The configuration of the optical member OE is given by way of example only and may be appropriately modified. While the second anisotropic diffusion layer AD2 is layered in contact with the first anisotropic diffusion layer AD1, the present embodiment is not limited thereto. The second anisotropic diffusion layer AD2 may be layered in a manner separated from the first anisotropic diffusion layer AD1, and another optical functional layer may be provided between the second anisotropic diffusion layer AD2 and the first anisotropic diffusion layer AD1.

While the first region PST has a columnar structure, the present embodiment is not limited thereto. The first region PST may have a louver structure having a plate shape inclining with respect to the third direction Dz.

Second Embodiment

Figure 12:
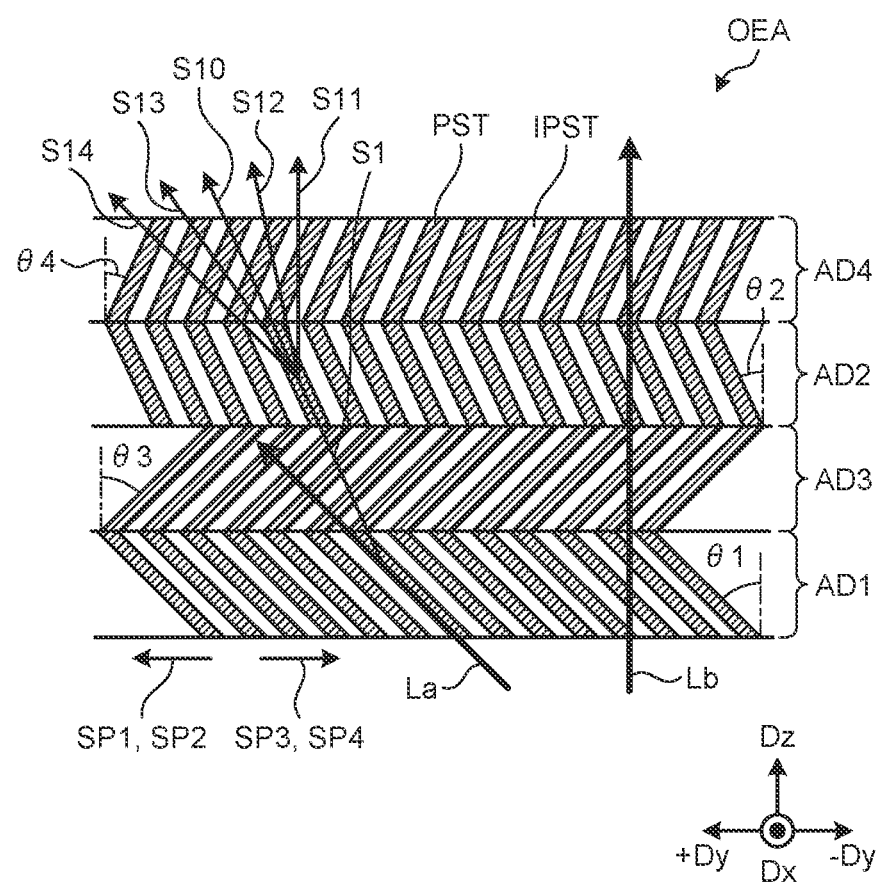
FIG. 12 is a sectional view schematically illustrating an optical member according to a second embodiment.

FIG. 12 is a sectional view schematically illustrating an optical member according to a second embodiment. In the following description, the same components as those described in the embodiment above are denoted by the same reference numerals, and overlapping explanation thereof is omitted.

As illustrated in FIG. 12, an optical member OEA according to the second embodiment includes the first anisotropic diffusion layer AD1, the second anisotropic diffusion layer AD2, a third anisotropic diffusion layer AD3, and a fourth anisotropic diffusion layer AD4. The first anisotropic diffusion layer AD1, the third anisotropic diffusion layer AD3, the second anisotropic diffusion layer AD2, and the fourth anisotropic diffusion layer AD4 are layered in this order in the third direction Dz. In other words, the third anisotropic diffusion layer AD3 is provided between the first anisotropic diffusion layer AD1 and the second anisotropic diffusion layer AD2 in the third direction Dz. The fourth anisotropic diffusion layer AD4 is provided farther away from the substrate 21 (array substrate 2) in the third direction Dz than the third anisotropic diffusion layer AD3 is.

The third anisotropic diffusion layer AD3 and the fourth anisotropic diffusion layer AD4 each include the first regions PST and the second region IPST in a manner similar to the first anisotropic diffusion layer AD1 and the second anisotropic diffusion layer AD2. The first regions PST of the third anisotropic diffusion layer AD3 and the fourth anisotropic diffusion layer AD4 also have a columnar structure.

As illustrated in FIG. 12, the first regions PST of the third anisotropic diffusion layer AD3 and the fourth anisotropic diffusion layer AD4 incline opposite to the first regions PST of the first anisotropic diffusion layer AD1 and the second anisotropic diffusion layer AD2 with respect to the third direction Dz. In other words, the first regions PST of the first anisotropic diffusion layer AD1 and the second anisotropic diffusion layer AD2 incline in the +Dy direction with respect to the third direction Dz. The first regions PST of the third anisotropic diffusion layer AD3 and the fourth anisotropic diffusion layer AD4 incline in the −Dy direction with respect to the third direction Dz.

A third angle θ3 is the angle formed by the extension direction of the first region PST of the third anisotropic diffusion layer AD3 and the third direction Dz. A fourth angle θ4 is the angle formed by the extension direction of the first region PST of the fourth anisotropic diffusion layer AD4 and the third direction Dz. The absolute value of the third angle θ3 is different from the absolute value of the fourth angle θ4. More specifically, the absolute value of the third angle θ3 formed by the boundary between the first region PST (high refractive index region) and the second region IPST (low refractive index region) of the third anisotropic diffusion layer AD3 and the third direction Dz is different from the absolute value of the fourth angle θ4 formed by the boundary between the first region PST (high refractive index region) and the second region IPST (low refractive index region) of the fourth anisotropic diffusion layer AD4 and the third direction Dz. More preferably, the absolute value of the third angle θ3 is larger than that of the fourth angle θ4.

In the sectional structure, the third anisotropic diffusion layer AD3 is symmetrical to the first anisotropic diffusion layer AD1 about a virtual line parallel to the second direction Dy. In other words, the absolute value of the third angle θ3 is equal to that of the first angle θ1. In the sectional structure, the fourth anisotropic diffusion layer AD4 is symmetrical to the second anisotropic diffusion layer AD2 about a virtual line parallel to the second direction Dy. In other words, the absolute value of the fourth angle θ4 is equal to that of the second angle θ2.

As described above, the first anisotropic diffusion layer AD1 scatters the incident light La. The following explanation is made focusing on the scattered light S1, which is on the high polar angle side, out of the scattered lights S1, S2, S3, and S4 (refer to FIG. 8) of the light La. The third anisotropic diffusion layer AD3 is provided between the first anisotropic diffusion layer AD1 and the second anisotropic diffusion layer AD2. The scattered light S1, however, does not fall within the light diffusion angle range of the third anisotropic diffusion layer AD3 (the traveling direction of the scattered light S1 is different from the third angle θ3 by approximately ±20° or greater, for example). As a result, the scattered light S1 passes through the third anisotropic diffusion layer AD3 without being scattered. The scattered light S1 is parallel to the extension direction of the first region PST of the second anisotropic diffusion layer AD2. In other words, the scattered light S1 is scattered by the second anisotropic diffusion layer AD2 because it travels in a direction parallel to the second angle θ2.

The scattered lights S11, S12, S13, and S14 scattered by the second anisotropic diffusion layer AD2 are incident on the fourth anisotropic diffusion layer AD4. The scattered lights S11, S12, S13, and S14, however, do not fall within the light diffusion angle range of the fourth anisotropic diffusion layer AD4 (the traveling directions of the scattered lights S11, S12, S13, and S14 are different from the fourth angle θ4 by approximately ±20° or greater, for example). As a result, the scattered lights S11, S12, S13, and S14 pass through the fourth anisotropic diffusion layer AD4 without being scattered.

Similarly, light incident at the third angle θ3 in the −Dy direction with respect to the third direction Dz is scattered by the third anisotropic diffusion layer AD3 and the fourth anisotropic diffusion layer AD4. Part of the components of the scattered light scattered by the fourth anisotropic diffusion layer AD4 is directed in a direction parallel to the third direction Dz. The light incident at the third angle θ3 passes through the first anisotropic diffusion layer AD1 and the second anisotropic diffusion layer AD2 without being scattered.

The third angle θ3 and the fourth angle θ4 are larger than 20°. Consequently, the light Lb parallel to the third direction Dz passes through the first anisotropic diffusion layer AD1 to the fourth anisotropic diffusion layer AD4 without being scattered.

Figure 13:
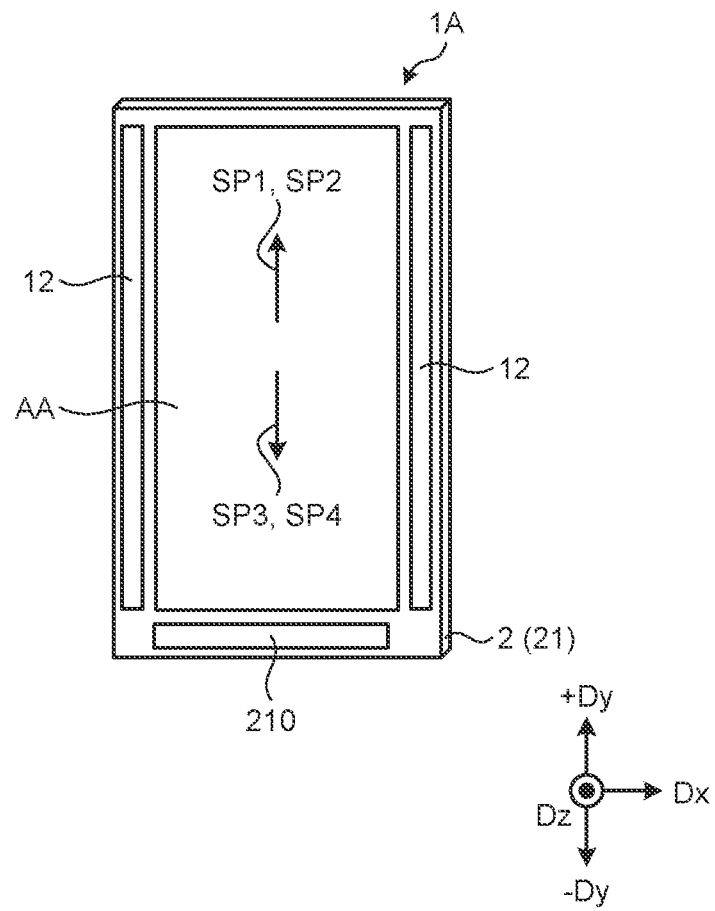
FIG. 13 is a view for explaining azimuth angles of the optical member according to the second embodiment.

FIG. 13 is a view for explaining the azimuth angles of the optical member according to the second embodiment. The azimuth angles SP1 and SP2 illustrated in FIG. 13 indicate the azimuth angles of the first anisotropic diffusion layer AD1 and the second anisotropic diffusion layer AD2, respectively. Azimuth angles SP3 and SP4 indicate the azimuth angles of the third anisotropic diffusion layer AD3 and the fourth anisotropic diffusion layer AD4, respectively. The azimuth angles SP1, SP2, SP3, and SP4 are the directions of the scattering central axes of the first anisotropic diffusion layer AD1 to the fourth anisotropic diffusion layer AD4, respectively, in planar view, that is, the extension direction of the first regions PST having a columnar structure.

As illustrated in FIG. 13, the azimuth angles SP1 and SP2 are directed in the +Dy direction. The azimuth angle SP3 (third azimuth angle) is directed in a direction equal to that of the azimuth angle SP4 (fourth azimuth angle). The azimuth angles SP3 and SP4 are directed in a direction different from that of the azimuth angles SP1 and SP2, that is, the −Dy direction opposite to the direction of the azimuth angles SP1 and SP2.

In the optical member OEA of a display device 1A, the first anisotropic diffusion layer AD1 and the second anisotropic diffusion layer AD2 can scatter light having an incident angle inclining in the +Dy direction with respect to the third direction Dz. The third anisotropic diffusion layer AD3 and the fourth anisotropic diffusion layer AD4 can scatter light having an incident angle inclining in the −Dy direction with respect to the third direction Dz.

Figure 14:
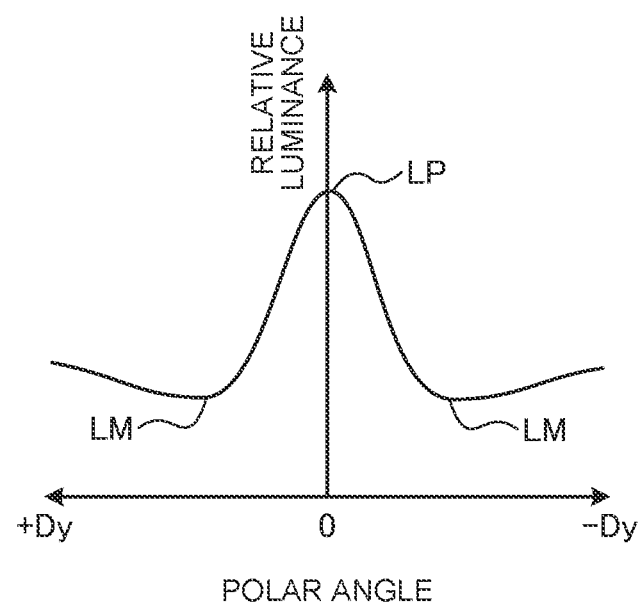
FIG. 14 is a graph schematically illustrating a relation between the relative luminance of light emitted from a display device according to the second embodiment and the polar angle.

FIG. 14 is a graph schematically illustrating a relation between the relative luminance of light emitted from the display device according to the second embodiment and the polar angle. The polar angles illustrated in FIG. 14 are polar angles on a plane defined by the azimuth angles SP1, SP2, SP3, and SP4 along the second direction Dy and the third direction Dz.

As illustrated in FIG. 14, the maximum LP of the relative luminance of light emitted from the display device 1A coincides with a polar angle of 0°, that is, the third direction Dz. The polar angle dependence of the relative luminance is substantially symmetrical about the direction of a polar angle of 0°. The absolute value of the polar angle indicating the minimum LM in the +Dy direction is equal to that of the polar angle indicating the minimum LM in the −Dy direction. This is because the third anisotropic diffusion layer AD3 and the fourth anisotropic diffusion layer AD4 have sectional structures symmetrical to the sectional structures of the first anisotropic diffusion layer AD1 and the second anisotropic diffusion layer AD2, respectively.

The relative luminance in the direction of a polar angle of 0° is higher than that in the graph of the polar angle dependence according to the first embodiment illustrated in FIG. 11. In other words, the difference between the minimum LM and the maximum LP according to the second embodiment is larger, and the half width of the relative luminance is smaller. This is because the optical member OEA according to the second embodiment changes the traveling directions of the light having an incident angle inclining in the +Dy direction and the light having an incident angle inclining in the −Dy direction with respect to the third direction Dz and directs the light in the third direction Dz, thereby increasing the relative luminance in the third direction Dz. As described above, the display device 1A according to the second embodiment can effectively improve the relative luminance of light in the normal direction of the array substrate 2.

Modifications

Figure 15:
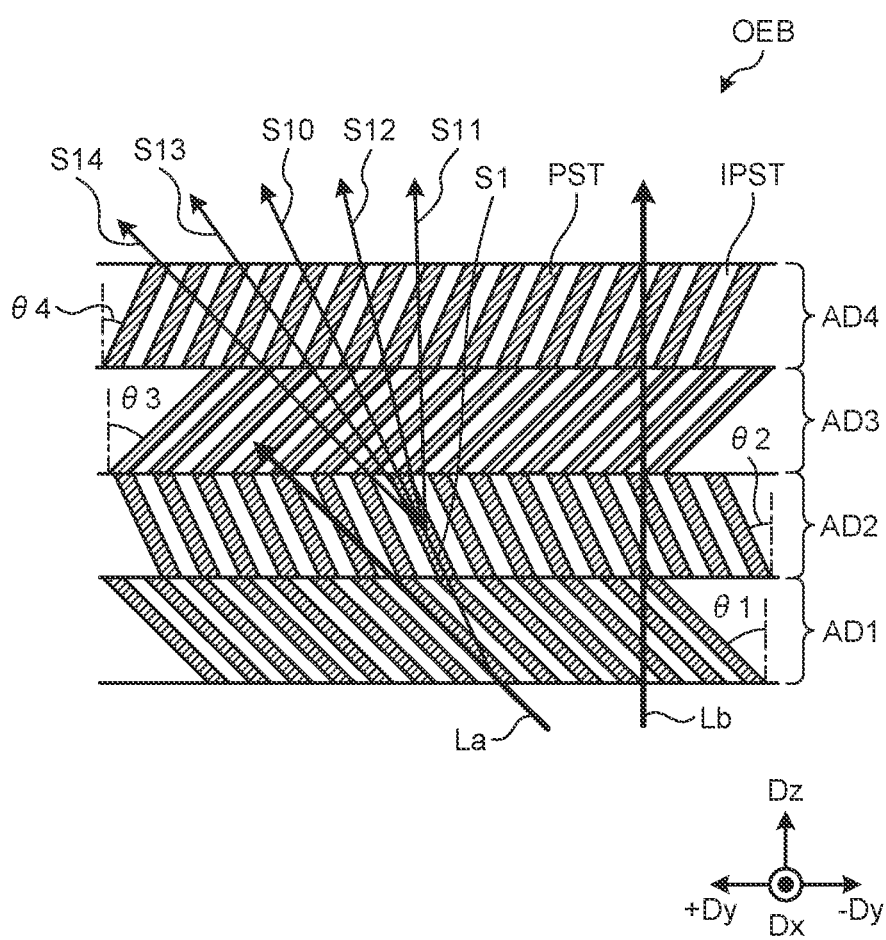
FIG. 15 is a sectional view schematically illustrating an optical member according to a modification of the second embodiment.

FIG. 15 is a sectional view schematically illustrating an optical member according to a modification of the second embodiment. As illustrated in FIG. 15, in an optical member OEB according to the modification of the second embodiment, the first anisotropic diffusion layer AD1, the second anisotropic diffusion layer AD2, the third anisotropic diffusion layer AD3, and the fourth anisotropic diffusion layer AD4 are layered in this order in the third direction Dz.

The structures of the first anisotropic diffusion layer AD1 to the fourth anisotropic diffusion layer AD4 are the same as those according to the second embodiment. In other words, the light La having an incident angle inclining in the +Dy direction with respect to the third direction Dz is scattered by the first anisotropic diffusion layer AD1. The scattered light S1 out of the components of the scattered light of the light La is diffused by the second anisotropic diffusion layer AD2. The traveling directions of the scattered lights S11 and S12 are directed toward the lower polar angle side than the scattering central axis S10 of the scattered light S1. The scattered lights S11, S12, S13, and S14 pass through the third anisotropic diffusion layer AD3 and the fourth anisotropic diffusion layer AD4 without being scattered.

Light having an incident angle inclining in the −Dy direction with respect to the third direction Dz is not scattered by the first anisotropic diffusion layer AD1 or the second anisotropic diffusion layer AD2 and is incident on the third anisotropic diffusion layer AD3. The light having an incident angle inclining in the −Dy direction with respect to the third direction Dz is scattered by the third anisotropic diffusion layer AD3 and the fourth anisotropic diffusion layer AD4. The travelling direction of part of the scattered light scattered by the fourth anisotropic diffusion layer AD4 is directed toward the low polar angle side.

The layering order from the first anisotropic diffusion layer AD1 to the fourth anisotropic diffusion layer AD4 is not limited to those in the examples illustrated in FIGS. 12 and 15. The second anisotropic diffusion layer AD2 having the second angle θ2 simply needs to be positioned farther away from the substrate 21 (in the third direction Dz) than the first anisotropic diffusion layer AD1 having the first angle θ1 is, and the fourth anisotropic diffusion layer AD4 having the fourth angle θ4 simply needs to be positioned farther away from the substrate 21 (in the third direction Dz) than the third anisotropic diffusion layer AD3 having the third angle θ3 is. For example, the third anisotropic diffusion layer AD3, the fourth anisotropic diffusion layer AD4, the first anisotropic diffusion layer AD1, the second anisotropic diffusion layer AD2 may be layered in this order in the third direction Dz. Alternatively, at least one of the third anisotropic diffusion layer AD3 and the fourth anisotropic diffusion layer AD4 may be disposed between the first anisotropic diffusion layer AD1 and the second anisotropic diffusion layer AD2 in the third direction Dz.

Third Embodiment

Figure 16:
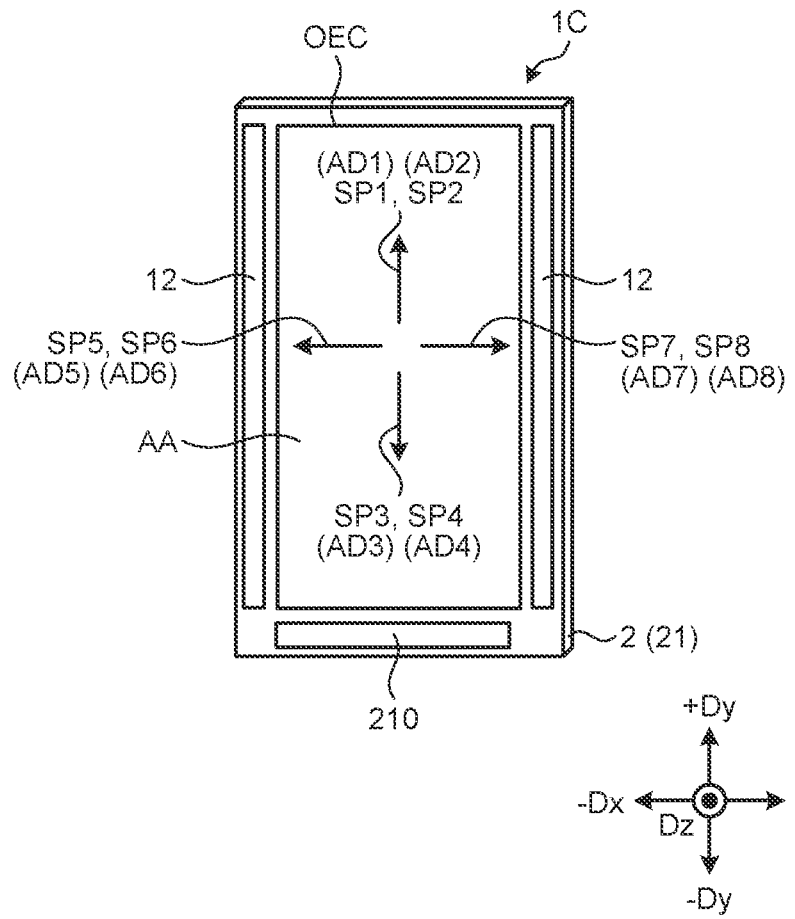
FIG. 16 is a view for explaining azimuth angles of an optical member according to a third embodiment.

FIG. 16 is a view for explaining azimuth angles of an optical member according to a third embodiment. As illustrated in FIG. 16, an optical member OEC of a display device 1C according to the third embodiment has an eight-layered structure from the first anisotropic diffusion layer AD1 to an eighth anisotropic diffusion layer AD8. The structures of the first anisotropic diffusion layer AD1 to the fourth anisotropic diffusion layer AD4 are the same as those according to the second embodiment.

Similarly to the first anisotropic diffusion layer AD1 to the fourth anisotropic diffusion layer AD4, the fifth anisotropic diffusion layer AD5 to the eighth anisotropic diffusion layer AD8 each include the first regions PST having a columnar structure and the second region IPST provided around the first regions PST. In the fifth anisotropic diffusion layer AD5 to the eighth anisotropic diffusion layer AD8, the extension direction of the first region PST is positioned in a plane defined by the first direction Dx and the third direction Dz in the same section. In the fifth anisotropic diffusion layer AD5 to the eighth anisotropic diffusion layer AD8, the extension direction of the first region PST inclines in the +Dx direction or the −Dx direction with respect to the third direction Dz.

The sectional structure of the fifth anisotropic diffusion layer AD5 to the eighth anisotropic diffusion layer AD8 cut along the first direction Dx can be the same as the sectional structure of the first anisotropic diffusion layer AD1 to the fourth anisotropic diffusion layer AD4 illustrated in FIG. 12 or 15. The angles formed by the extension direction of the first region PST of the fifth anisotropic diffusion layer AD5 to the eighth anisotropic diffusion layer AD8 and the third direction Dz may be different from the first angle θ1 to the fourth angle θ4 of the first anisotropic diffusion layer AD1 to the fourth anisotropic diffusion layer AD4.

As illustrated in FIG. 16, an azimuth angle SP5 (fifth azimuth angle) and an azimuth angle SP6 (sixth azimuth angle) of the fifth anisotropic diffusion layer AD5 and the sixth anisotropic diffusion layer AD6 are the same direction and directed in the −Dx direction. In other words, the azimuth angles SP5 and SP6 are orthogonal to the azimuth angles SP1 and SP2. Azimuth angles SP7 and SP8 of the seventh anisotropic diffusion layer AD7 and the eighth anisotropic diffusion layer AD8 are directed in the +Dx direction opposite to the direction of the azimuth angles SP5 and SP6.

In the optical member OEC of the display device 1C, the fifth anisotropic diffusion layer AD5 and the sixth anisotropic diffusion layer AD6 can scatter light having an incident angle inclining in the −Dx direction with respect to the third direction Dz. The seventh anisotropic diffusion layer AD7 and the eighth anisotropic diffusion layer AD8 can scatter light having an incident angle inclining in the +Dx direction with respect to the third direction Dz.

Figure 17:
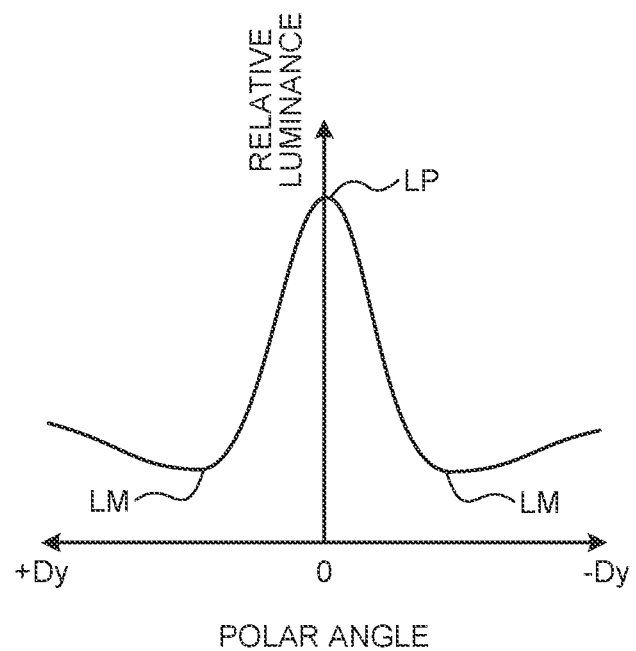
FIG. 17 is a graph schematically illustrating a relation between the relative luminance of light emitted from a display device according to the third embodiment and the polar angle.

FIG. 17 is a graph schematically illustrating a relation between the relative luminance of light emitted from the display device according to the third embodiment and the polar angle. The polar angles illustrated in FIG. 17 are polar angles on a plane defined by the azimuth angles SP1, SP2, SP3, and SP4 along the second direction Dy and the third direction Dz. The optical member OEC according to the third embodiment also has a symmetric property in the first direction Dx. For this reason, a graph indicating polar angles on a plane defined by the azimuth angles SP5, SP6, SP7, and SP8 along the first direction Dx and the third direction Dz shows the same polar angle dependence as that illustrated in FIG. 17.

As illustrated in FIG. 17, the maximum LP of the relative luminance of light emitted from the display device 1C coincides with a polar angle of 0°, that is, the third direction Dz. The polar angle dependence of the relative luminance is substantially symmetrical about the direction of a polar angle of 0°. The absolute value of the polar angle indicating the minimum LM in the +Dy direction is equal to that of the polar angle indicating the minimum LM in the −Dy direction. The absolute value of the polar angle indicating the minimum LM in the +Dx direction is equal to that of the polar angle indicating the minimum LM in the −Dx direction.

The relative luminance in the direction of a polar angle of 0° according to the third embodiment is higher than the polar angle dependence of the relative luminance according to the second embodiment illustrated in FIG. 14. In other words, the difference between the minimum LM and the maximum LP according to the third embodiment is larger, and the half width of the relative luminance is smaller. This is because the optical member OEC changes the traveling directions of the light having incident angles inclining in four azimuth angle directions, that is, the +Dy direction, the −Dy direction, the +Dx direction, and the −Dx direction with respect to the third direction Dz and directs the light in the third direction Dz. As described above, the display device 1C according to the third embodiment can increase the relative luminance of light in the normal direction of the array substrate 2.

Fourth Embodiment

Figure 18:
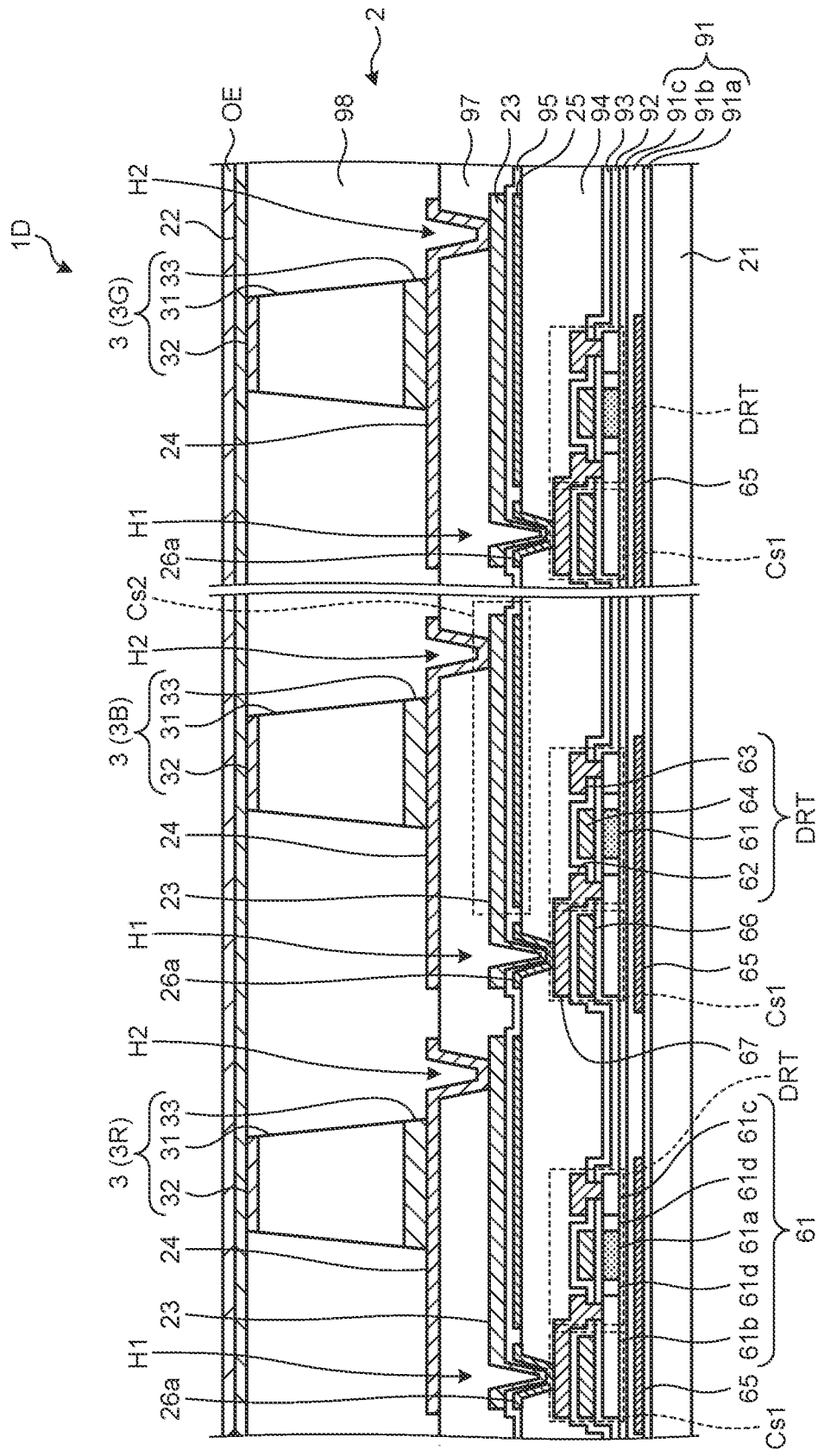
FIG. 18 is a sectional view schematically illustrating a display device according to a fourth embodiment.

FIG. 18 is a sectional view schematically illustrating a display device according to a fourth embodiment. As illustrated in FIG. 18, the optical member OE of a display device 1D according to the fourth embodiment is provided on the cathode electrode 22. In other words, the optical member OE is provided directly on the cathode electrode 22 without the overcoat layer OC (refer to FIG. 5) interposed therebetween. Without the overcoat layer OC, the display device of the present embodiment can increase the amount of light incident on the optical member OE compared with the first embodiment.

The optical members OE, OEA, OEB, and OEC according to the first to the third embodiments and the modification described above can be used as the optical member OE illustrated in FIG. 18.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:

1. A light emitting element array comprising:
   a substrate;
   a plurality of light emitting elements arrayed to the substrate;
   a first anisotropic diffusion layer facing the substrate with the light emitting elements interposed between the first anisotropic diffusion layer and the substrate;
   a second anisotropic diffusion layer;
   a third anisotropic diffusion layer;
   a fourth anisotropic diffusion layer;
   a fifth anisotropic diffusion layer; and
   a sixth anisotropic diffusion layer, wherein
   the first anisotropic diffusion layer and the second anisotropic diffusion layer are layered,
   the first anisotropic diffusion layer and the second anisotropic diffusion layer each include a region in an in-plane direction including a high refractive index region and a low refractive index region in a mixed manner,
   an absolute value of a first angle formed by a boundary between the high refractive index region and the low refractive index region of the first anisotropic diffusion layer and a direction perpendicular to the substrate is different from an absolute value of a second angle formed by a boundary between the high refractive index region and the low refractive index region of the second anisotropic diffusion layer and the direction perpendicular to the substrate,
   an absolute value of a third angle formed by a boundary between the high refractive index region and the low refractive index region of the third anisotropic diffusion layer and the direction perpendicular to the substrate is different from an absolute value of a fourth angle formed by a boundary between the high refractive index region and the low refractive index region of the fourth anisotropic diffusion layer and the direction perpendicular to the substrate, and
   a first azimuth angle of a scattering central axis of light of the first anisotropic diffusion layer and a second azimuth angle of a scattering central axis of light of the second anisotropic diffusion layer are orthogonal to a fifth azimuth angle of a scattering central axis of light of the fifth anisotropic diffusion layer and a sixth azimuth angle of a scattering central axis of light of the sixth anisotropic diffusion layer in planar view viewed from the direction perpendicular to the substrate.

2. The light emitting element array according to claim 1, wherein
   the second anisotropic diffusion layer is disposed farther away from the substrate in the direction perpendicular to the substrate than the first anisotropic diffusion layer is, and
   the absolute value of the first angle is larger than the absolute value of the second angle.

3. The light emitting element array according to claim 1, wherein
   the first azimuth angle of the scattering central axis of light of the first anisotropic diffusion layer is equal to the second azimuth angle of the scattering central axis of light of the second anisotropic diffusion layer in planar view viewed from the direction perpendicular to the substrate.

4. The light emitting element array according to claim 1, wherein
   the fourth anisotropic diffusion layer is disposed farther away from the substrate in the direction perpendicular to the substrate than the third anisotropic diffusion layer is, and
   the absolute value of the third angle is larger than the absolute value of the fourth angle.

5. The light emitting element array according to claim 1, wherein
   a third azimuth angle of a scattering central axis of light of the third anisotropic diffusion layer is equal to a fourth azimuth angle of a scattering central axis of light of the fourth anisotropic diffusion layer in planar view viewed from the direction perpendicular to the substrate.

6. The light emitting element array according to claim 5, wherein
   the third azimuth angle and the fourth azimuth angle are directed in a direction opposite to a direction of the first azimuth angle of the scattering central axis of light of the first anisotropic diffusion layer and the second azimuth angle of the scattering central axis of light of the second anisotropic diffusion layer.

7. The light emitting element array according to claim 1, wherein
   the first anisotropic diffusion layer, the second anisotropic diffusion layer, the third anisotropic diffusion layer, and the fourth anisotropic diffusion layer are layered in the order as listed, in the direction perpendicular to the substrate.

8. The light emitting element array according to claim 1, wherein
   at least one of the third anisotropic diffusion layer and the fourth anisotropic diffusion layer is disposed between the first anisotropic diffusion layer and the second anisotropic diffusion layer in the direction perpendicular to the substrate.

9. The light emitting element array according to claim 1, wherein
   a plurality of the high refractive index regions each have a columnar shape and incline with respect to the direction perpendicular to the substrate, and
   the low refractive index region is disposed between the high refractive index regions.

10. The light emitting element array according to claim 1, wherein relative luminance of light emitted from the light emitting elements is higher at a polar angle of 45° than at a polar angle of 0°.

* * * * *